(12) United States Patent
Hwang et al.

(10) Patent No.: US 10,911,032 B2
(45) Date of Patent: Feb. 2, 2021

(54) FLIP-FLOP

(71) Applicant: Samsung Electronics Co., Ltd., Suwon-si (KR)

(72) Inventors: Hyun-Chul Hwang, Suwon-si (KR); Min-Su Kim, Hwaseong-si (KR); Dae-Seong Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/524,609

(22) Filed: Jul. 29, 2019

(65) Prior Publication Data
US 2019/0379361 A1    Dec. 12, 2019

Related U.S. Application Data

(63) Continuation of application No. 15/669,072, filed on Aug. 4, 2017, now Pat. No. 10,396,761.

(30) Foreign Application Priority Data

Nov. 23, 2016    (KR) ........................ 10-2016-0156812

(51) Int. Cl.
*H03K 3/012* (2006.01)
*H03K 3/3562* (2006.01)
*H03K 3/356* (2006.01)

(52) U.S. Cl.
CPC ......... *H03K 3/012* (2013.01); *H03K 3/35625* (2013.01); *H03K 3/356182* (2013.01)

(58) Field of Classification Search
CPC ............. H03K 3/012; H03K 3/356182; H03K 3/35625
See application file for complete search history.

(56) References Cited

U.S. PATENT DOCUMENTS

| 4,695,743 | A | * | 9/1987 | Des Brisay, Jr. .... H03K 3/0372 327/203 |
| 6,127,867 | A | | 10/2000 | Coughlin, Jr. et al. |
| 6,937,079 | B1 | | 8/2005 | Zhao et al. |
| 6,977,528 | B2 | | 12/2005 | Kang et al. |
| 7,688,933 | B2 | | 3/2010 | Morosawa |
| 8,072,252 | B2 | * | 12/2011 | Bailey ................. H03K 3/3562 327/210 |
| 9,331,680 | B2 | | 5/2016 | Gurumurthy et al. |
| 9,490,781 | B2 | | 11/2016 | Sharma et al. |

FOREIGN PATENT DOCUMENTS

| EP | 1940027 A2 | 7/2008 |
| JP | 2004-213776 A | 7/2004 |
| JP | 2004-214997 A | 7/2004 |
| KR | 10-1998-0066602 | 10/1998 |
| KR | 10-0376915 B1 | 3/2003 |

* cited by examiner

*Primary Examiner* — Dinh T Le
(74) *Attorney, Agent, or Firm* — Harness, Dickey & Pierce, P.L.C.

(57) ABSTRACT

A flip-flop includes a first node charging circuit configured to charge a first node with inverted input data generated by inverting input data, a second node charging circuit configured to charge a second node with the input data, and first through eighth NMOS transistors. The flip-flop is configured to latch the input data at rising edges of a clock signal and output latched input data as output data. The flip-flop includes an internal circuit configured to charge a sixth node with inverted input data generated by inverting the latched input data.

5 Claims, 27 Drawing Sheets

FLIP-FLOP

CROSS-REFERENCE TO RELATED APPLICATION(S)

This application is a continuation of U.S. patent application Ser. No. 15/669,072, filed on Aug. 4, 2017, which claims priority under 35 USC § 119 to Korean Patent Application No. 10-2016-0156812, filed on Nov. 23, 2016 in the Korean Intellectual Property Office (KIPO), the contents of each of which are incorporated herein in its entirety by reference.

BACKGROUND

1. Technical Field

Example embodiments relate generally to a logic circuit. More particularly, some example embodiments relate to a flip-flop that latches input data at rising edges of a clock signal and outputs latched input data as output data.

2. Description of the Related Art

Recently, according to a mobile convergence trend, there is a rising interest on a low power technology for a mobile device (e.g., a smart phone, a smart pad, etc.). Generally, since the mobile device uses a limited power such as a battery, manufacturing (or, designing) the mobile device with low power chips including low power flip-flops is necessary as well as efficient power management for the mobile device to consume low power. A master-slave flip-flop has been used for a long time because a size of the master-slave flip-flop is relatively small and the master-slave flip-flop has high reliability. However, since a conventional master-slave flip-flop includes internal nodes that are repeatedly (e.g., alternately) charged and discharged in response to a clock signal, the conventional master-slave flip-flop consumes power even while input data is not changed. Thus, the conventional master-slave flip-flop cannot satisfy the low power level that a recent mobile device of which an operating frequency is relatively high requires.

SUMMARY

Some example embodiments provide a flip-flop (or, sometimes referred to as a sequential circuit) that can consume no power while input data is not changed (e.g., the flip-flop can operate with low power) by including no internal node that is repeatedly charged and discharged in response to a clock signal.

According to an aspect of some example embodiments, a flip-flop may include a first node charging circuit configured to charge a first node with inverted input data, a second node charging circuit configured to charge a second node with input data, a first n-channel metal oxide semiconductor (NMOS) transistor including a first terminal that is connected to the first node, a second terminal, and a gate terminal, a second NMOS transistor including a first terminal that is connected to the second terminal of the first NMOS transistor, a second terminal that is connected to a low power voltage, and a gate terminal, a third NMOS transistor including a first terminal that is connected to the first node, a second node, and a gate terminal that is connected to the second node, a fourth NMOS transistor including a first terminal that is connected to the second node, a second terminal, and a gate terminal, a fifth NMOS transistor including a first terminal that is connected to the second terminal of the fourth NMOS transistor, a second terminal that is connected to the low power voltage, and a gate terminal, a sixth NMOS transistor including a first terminal that is connected to the second node, a second terminal, and a gate terminal that is connected to the first node, a seventh NMOS transistor including a first terminal that is connected to the second terminal of the third NMOS transistor, a second terminal that is connected to a sixth node, and a gate terminal configured to receive a clock signal, and an eighth NMOS transistor including a first terminal that is connected to the second terminal of the sixth NMOS transistor, a second terminal that is connected to a fifth node, and a gate terminal configured to receive the clock signal. Here, the flip-flop may be configured to latch the input data at rising edges of the clock signal, and output the latched input data as output data.

According to another aspect of some example embodiments, a flip-flop may include a first OR-gate element including a first input terminal configured to receive a clock signal, a second input terminal configured to receive input data, and an output terminal configured to output an OR-operation result between the clock signal and the input data, a first NAND-gate element including a first input terminal that is connected to the output terminal of the first OR-gate element, a second input terminal that is connected to a second node, and an output terminal that is connected to a first node, said output terminal of said first NAND-gate element being configured to output a NAND-operation result between the OR-operation result of the first OR-gate element and a voltage signal of the second node at the first node, a second OR-gate element including a first input terminal configured to receive inverted input data, a second input terminal configured to receive the clock signal, and an output terminal configured to output an OR-operation result between the inverted input data and the clock signal, a second NAND-gate element including a first input terminal that is connected to the first node, a second input terminal that is connected to the output terminal of the second OR-gate element, and an output terminal that is connected to the second node, said output terminal of the second NAND-gate element being configured to output a NAND-operation result between a voltage signal of the first node and the OR-operation result of the second OR-gate element at the second node, a first inverter element connected between the second input terminal of the first OR-gate element and the first input terminal of the second OR-gate element, said first inverter element being configured to invert the input data and to output the inverted input data, a third AND-gate element including a first input terminal that is connected to the first node, a second input terminal configured to receive the clock signal, and an output terminal configured to output an AND-operation result between the clock signal and the voltage signal of the first node, a first NOR-gate element including a first input terminal that is connected to the output terminal of the third AND-gate element, a second input terminal that is connected to a sixth node, and an output terminal that is connected to a fifth node, said output terminal of the first NOR-gate element being configured to output a NOR-operation result between the AND-operation result of the third AND-gate element and a voltage signal of the sixth node at the fifth node, a fourth AND-gate element including a first input terminal that is connected to the second node, a second input terminal configured to receive the clock signal, and an output terminal configured to output an AND-operation result between the voltage signal of the second node and the clock signal, and a second NOR-gate element including a first input terminal that is connected to the fifth node, a second input terminal that is connected to the output terminal of the fourth AND-gate element, and an output terminal that is connected to the sixth node, said output terminal of the second NOR-gate element being configured to output a NOR-operation result between a voltage signal of the fifth node and the AND-operation result of the fourth AND-gate element at the sixth node.

According to still another aspect of some example embodiments, a flip-flop may include a first AND-gate element including a first input terminal that is connected to a second node, a second input terminal configured to receive a clock signal, a third input terminal that is connected to a fifth node, and an output terminal configured to output an AND-operation result among a voltage signal of the second node, the clock signal, and a voltage signal of the fifth node, a first OR-gate element including a first input terminal that is connected to the output terminal of the first AND-gate element, a second input terminal configured to receive input data, and an output terminal configured to output an OR-operation result between the AND-operation result of the first AND-gate element and the input data, a first NAND-gate element including a first input terminal that is connected to the output terminal of the first OR-gate element, a second input terminal that is connected to the second node, and an output terminal that is connected to a first node, said output terminal of the first NAND-gate element being configured to output a NAND-operation result between the OR-operation result of the first OR-gate element and the voltage signal of the second node at the first node, a second AND-gate element including a first input terminal that is connected to the first node, a second input terminal configured to receive the clock signal, a third input terminal that is connected to a sixth node, and an output terminal configured to output an AND-operation result among a voltage signal of the first node, the clock signal, and a voltage signal of the sixth node, a second OR-gate element including a first input terminal configured to receive inverted input data, a second input terminal that is connected to the output terminal of the second AND-gate element, and an output terminal configured to output an OR-operation result between the inverted input data and the AND-operation result of the second AND-gate element, a second NAND-gate element including a first input terminal that is connected to the first node, a second input terminal that is connected to the output terminal of the second OR-gate element, and an output terminal that is connected to the second node, said output terminal of the second NAND-gate element being configured to output a NAND-operation result between the voltage signal of the first node and the OR-operation result of the second OR-gate element at the second node, a first inverter element connected between the second input terminal of the first OR-gate element and the first input terminal of the second OR-gate element, said first inverter element being configured to invert the input data and to output the inverted input data, a third OR-gate element including a first input terminal configured to receive the inverted input data, a second input terminal that is connected to the first node, and an output terminal configured to output an OR-operation result between the inverted input data and the voltage signal of the first node, a third AND-gate element including a first input terminal that is connected to the output terminal of the third OR-gate element, a second input terminal configured to receive the clock signal, a third input terminal that is connected to the first node, and an output terminal configured to output an AND-operation result among the OR-operation result of the third OR-gate element, the clock signal and the voltage signal of the first node, a first NOR-gate element including a first input terminal that is connected to the output terminal of the third AND-gate element, a second input terminal that is connected to the sixth node, and an output terminal that is connected to the fifth node, said output terminal of the first NOR-gate element being configured to output a NOR-operation result between the AND-operation result of the third AND-gate element and the voltage signal of the sixth node at the fifth node, a fourth OR-gate element including a first input terminal that is connected to the second node, a second input terminal configured to the input data, and an output terminal configured to output an OR-operation result between the voltage signal of the second node and the input data, a fourth AND-gate element including a first input terminal that is connected to the second node, a second input terminal configured to receive the clock signal, a third input terminal that is connected to the output terminal of the fourth OR-gate element, and an output terminal configured to output an AND-operation result among the voltage signal of the second node, the clock signal, and the OR-operation result of the fourth OR-gate element, and a second NOR-gate element including a first input terminal that is connected to the fifth node, a second input terminal that is connected to the output terminal of the fourth AND-gate element, and an output terminal that is connected to the sixth node, said output terminal of the second NOR-gate element being configured to output a NOR-operation result between the voltage signal of the fifth node and the AND-operation result of the fourth AND-gate element at the sixth node.

Therefore, a flip-flop according to some example embodiments may include an internal node that is charged by inverted input data (e.g., data generated by inverting input data) and an internal node that is charged by the input data, where the internal nodes complementarily operate (e.g., node-values of the internal nodes are complementarily determined) because the internal nodes are cross-connected, so that the flip-flop may prevent unnecessary power consumption while the input data is not changed. That is, the flip-flop may operate with low power by preventing the internal nodes from being repeatedly charged and discharged in response to a clock signal while the input data is not changed.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, some example embodiments will be explained in detail with reference to the accompanying drawings.

Figure 1A:
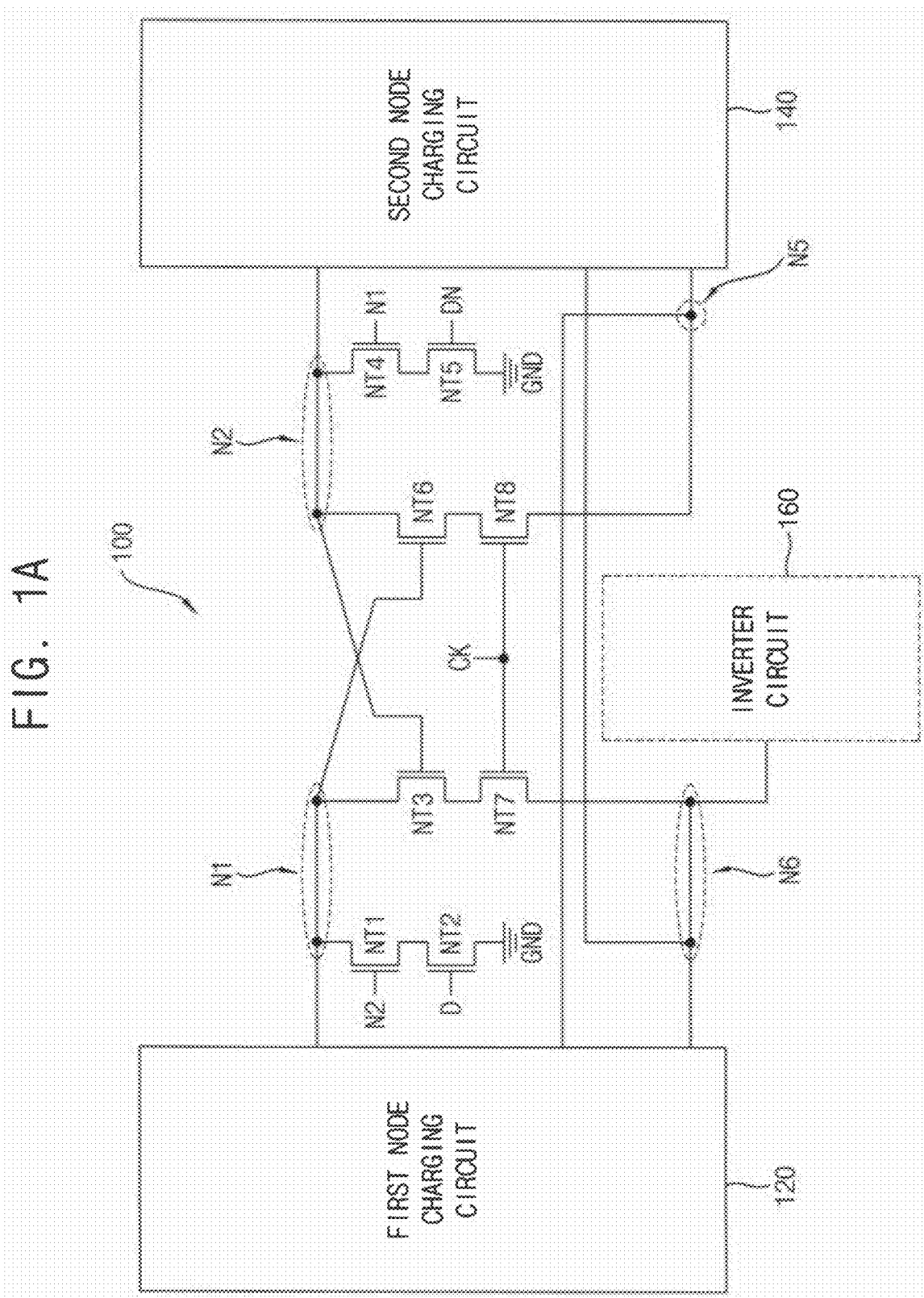
FIG. 1A is a circuit diagram illustrating a flip-flop according to some example embodiments.
Figure 1B:
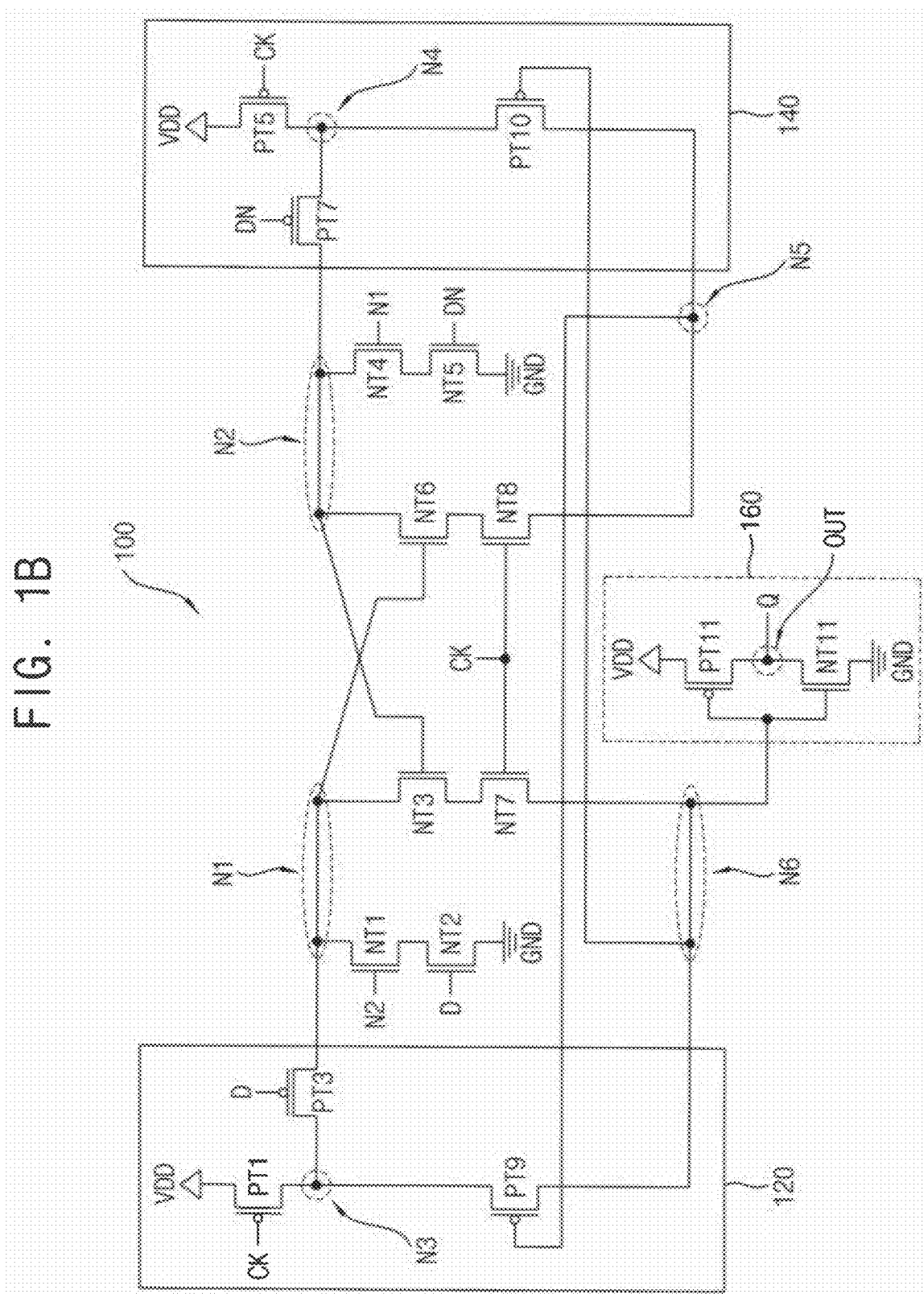
FIG. 1B is a detailed circuit diagram illustrating the flip-flop of FIG. 1A.
Figure 2:
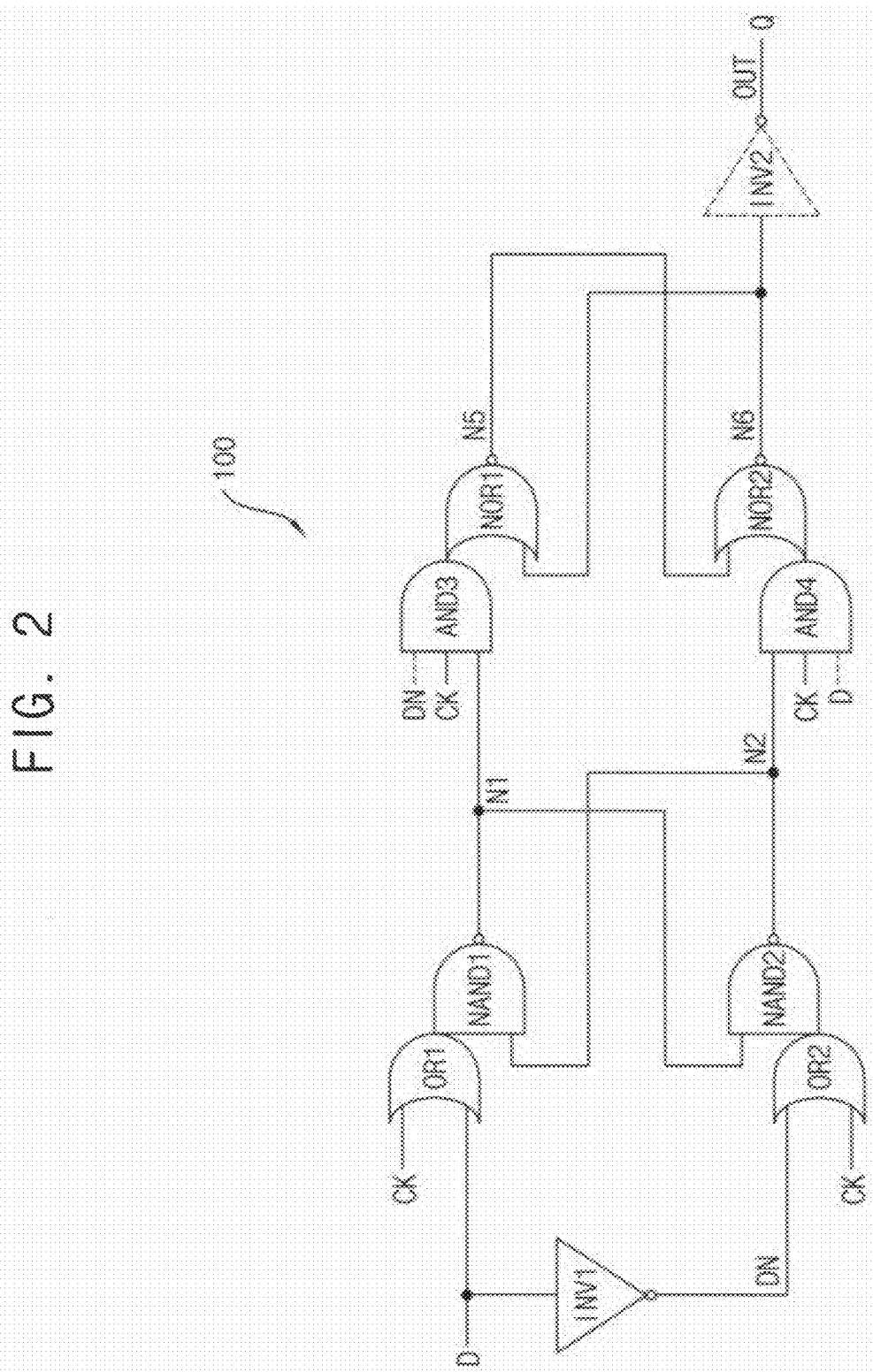
FIG. 2 is a block diagram illustrating an example in which the flip-flop of FIG. 1B is implemented by logic elements.
Figure 3:
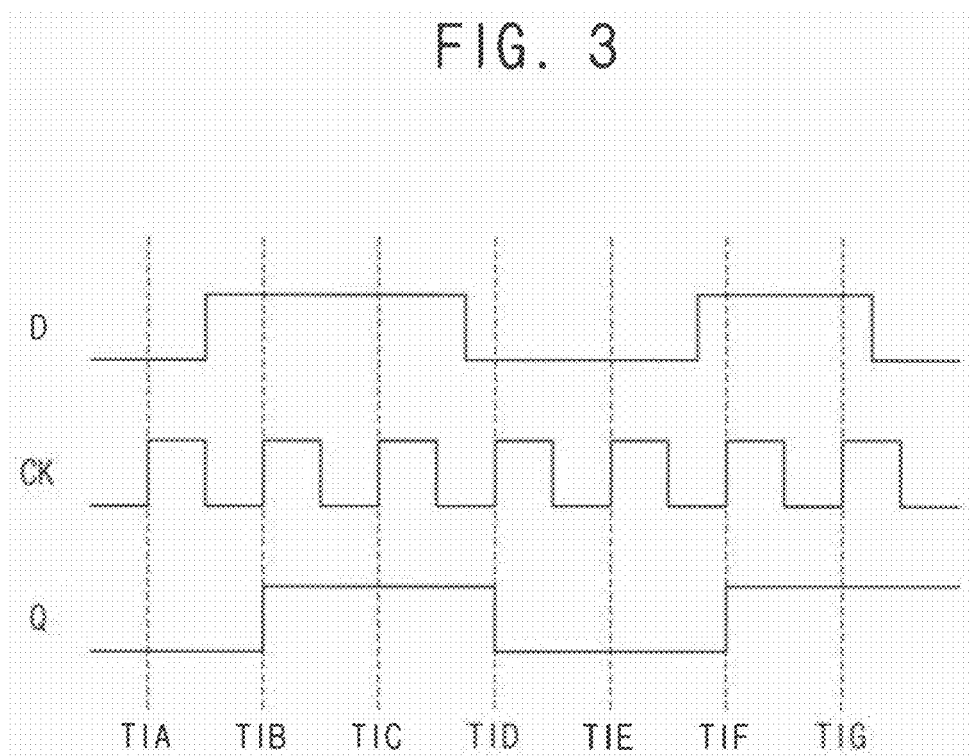
FIG. 3 is a timing diagram illustrating an example in which the flip-flop of FIG. 1B operates.

FIG. 1A is a circuit diagram illustrating a flip-flop according to some example embodiments. FIG. 1B is a detailed circuit diagram illustrating the flip-flop of FIG. 1A. FIG. 2 is a block diagram illustrating an example in which the flip-flop of FIG. 1B is implemented by logic elements. FIG. 3 is a timing diagram illustrating an example in which the flip-flop of FIG. 1B operates.

Referring to FIGS. 1A through 3, the flip-flop 100 may include a first node charging circuit 120, a second node charging circuit 140, and first through eighth n-channel metal oxide semiconductor (NMOS) transistors NT1 through NT8. In some example embodiments, the flip-flop 100 may further include an inverter circuit 160. Based on the above structure, the flip-flop 100 may latch input data D at rising edges of a clock signal CK and may output latched input data D as output data Q. In other words, the flip-flop 100 may be triggered at the rising edges of the clock signal CK.

The first node charging circuit 120 may charge a first node N1 with inverted input data DN, where the inverted input data DN is generated by inverting input data D. In an example embodiment, the first node charging circuit 120 may include a first p-channel metal oxide semiconductor (PMOS) transistor PT1, a third PMOS transistor PT3, and a ninth PMOS transistor PT9. The first PMOS transistor PT1 may include a first terminal that is connected to a high power voltage VDD, a second terminal that is connected to a third node N3, and a gate terminal that receives the clock signal CK. Thus, when the first PMOS transistor PT1 turns on in response to the clock signal CK, the high power voltage VDD may be applied to the third node N3. The third PMOS transistor PT3 may include a first terminal that is connected to the third node N3, a second terminal that is connected to the first node N1, and a gate terminal that receives the input data D. Thus, when the third PMOS transistor PT3 turns on in response to the input data D, the third node N3 may be connected to the first node N1. The ninth PMOS transistor PT9 may include a first terminal that is connected to the third node N3, a second terminal that is connected to a sixth node N6, and a gate terminal that is connected to a fifth node N5. Thus, when the ninth PMOS transistor PT9 turns on in response to a voltage signal of the fifth node N5, the third node N3 may be connected to the sixth node N6. In some example embodiments, the first node charging circuit 120 may further include transistors that perform an assistant operation such as a keeper element that performs data retention. For example, the first node charging circuit 120 may further include a second PMOS transistor PT2 including a first terminal that is connected to the high power voltage VDD, a second terminal that is connected to the third node N3, and a gate terminal that is connected to the second node N2, a fourth PMOS transistor PT4 including a first terminal that is connected to the high power voltage VDD, a second terminal that is connected to the first node N1, and a gate terminal that is connected to the second node N2, and a ninth NMOS transistor NT9 including a first terminal that is connected to the sixth node N6, a second terminal that is connected to a low power voltage GND, and a gate terminal that is connected to the fifth node N5. This structure will be described in detail with reference to FIGS. 4 through 5B.

The second node charging circuit 140 may charge the second node N2 with the input data D. In an example embodiment, the second node charging circuit 140 may include a fifth PMOS transistor PT5, a seventh PMOS transistor PT7, and a tenth PMOS transistor PT10. The fifth PMOS transistor PT5 may include a first terminal that is connected to the high power voltage VDD, a second terminal that is connected to a fourth node N4, and a gate terminal that receives the clock signal CK. Thus, when the fifth PMOS transistor PT5 turns on in response to the clock signal CK, the high power voltage VDD may be applied to the fourth node N4. The seventh PMOS transistor PT7 may include a first terminal that is connected to the fourth node N4, a second terminal that is connected to the second node N2, and a gate terminal that receives the inverted input data DN. Thus, when the seventh PMOS transistor PT7 turns on in response to the inverted input data DN, the fourth node N4 may be connected to the second node N2. The tenth PMOS transistor PT10 may include a first terminal that is connected to the fourth node N4, a second terminal that is connected to the fifth node N5, and a gate terminal that is connected to the sixth node N6. Thus, when the tenth PMOS transistor PT10 turns on in response to a voltage signal of the sixth node N6, the fourth node N4 may be connected to the fifth node N5. In some example embodiments, the second node charging circuit 140 may further include transistors that perform an assistant operation such as a keeper element that performs data retention. For example, the second node charging circuit 140 may further include a sixth PMOS transistor PT6 including a first terminal that is connected to the high power voltage VDD, a second terminal that is connected to the fourth node N4, and a gate terminal that is connected to the first node N1, an eighth PMOS transistor PT8 including a first terminal that is connected to the high power voltage VDD, a second terminal that is connected to the second node N2, and a gate terminal that is connected to the first node N1, and a tenth NMOS transistor NT10 including a first terminal that is connected to the fifth node N5, a second terminal that is connected to the low power voltage GND, and a gate terminal that is connected to the sixth node N6. This structure will be described in detail with reference to FIGS. 4 through 5B.

The first NMOS transistor NT1 and the second NMOS transistor NT2 may be connected in series between the first node N1 and the low power voltage GND. For example, the low power voltage GND may be a ground voltage. In an example embodiment, as illustrated in FIGS. 1A and 1B, the first NMOS transistor NT1 may include a first terminal that is connected to the first node N1, a second terminal that is connected to a first terminal of the second NMOS transistor NT2, and a gate terminal that is connected to the second node N2. The second NMOS transistor NT2 may include the first terminal that is connected to the second terminal of the first NMOS transistor NT1, a second terminal that is connected to the low power voltage GND, and a gate terminal that receives the input data D. In this case, when the first NMOS transistor NT1 turns on in response to a voltage signal of the second node N2 and when the second NMOS transistor NT2 turns on in response to the input data D, the low power voltage GND may be applied to the first node N1. In another example embodiment, the first NMOS transistor NT1 may include a first terminal that is connected to the first node N1, a second terminal that is connected to a first terminal of the second NMOS transistor NT2, and a gate terminal that receives the input data D. The second NMOS transistor NT2 may include the first terminal that is connected to the second terminal of the first NMOS transistor NT1, a second terminal that is connected to the low power voltage GND, and a gate terminal that is connected to the second node N2. In this case, when the first NMOS transistor NT1 turns on in response to the input data D and when the second NMOS transistor NT2 turns on in response to a voltage signal of the second node N2, the low power voltage GND may be applied to the first node N1. The fourth NMOS transistor NT4 and the fifth NMOS transistor NT5 may be connected in series between the second node N2 and the low power voltage GND. In an example embodiment, as illustrated in FIGS. 1A and 1B, the fourth NMOS transistor NT4 may include a first terminal that is connected to the second node N2, a second terminal that is connected to a first terminal of the fifth NMOS transistor NT5, and a gate terminal that is connected to the first node N1. The fifth NMOS transistor NT5 may include the first terminal that is connected to the second terminal of the fourth NMOS transistor NT4, a second terminal that is connected to the low power voltage GND, and a gate terminal that receives the inverted input data DN. In this case, when the fourth NMOS transistor NT4 turns on in response to a voltage signal of the first node N1 and when the fifth NMOS transistor NT5 turns on in response to the inverted input data DN, the low power voltage GND may be applied to the second node N2. In another example embodiment, the fourth NMOS transistor NT4 may include a first terminal that is connected to the second node N2, a second terminal that is connected to a first terminal of the fifth NMOS transistor NT5, and a gate terminal that receives the inverted input data DN. The fifth NMOS transistor NT5 may include a first terminal that is connected to the second terminal of the fourth NMOS transistor NT4, a second terminal that is connected to the low power voltage GND, and a gate terminal that is connected to the first node N1. In this case, when the fourth NMOS transistor NT4 turns on in response to the inverted input data DN and when the fifth NMOS transistor NT5 turns on in response to a voltage signal of the first node N1, the low power voltage GND may be applied to the second node N2.

The third NMOS transistor NT3 and the seventh NMOS transistor NT7 may be connected in series between the first node N1 and the sixth node N6. Specifically, the third NMOS transistor NT3 may include a first terminal that is connected to the first node N1, a second terminal that is connected to a first terminal of the seventh NMOS transistor NT7, and a gate terminal that is connected to the second node N2. Thus, when the third NMOS transistor NT3 turns on in response to a voltage signal of the second node N2, the first terminal of the seventh NMOS transistor NT7 may be connected to the first node N1. The seventh NMOS transistor NT7 may include the first terminal that is connected to the second terminal of the third NMOS transistor NT3, a second terminal that is connected to the sixth node N6, and a gate terminal that receives the clock signal CK. Thus, when the seventh NMOS transistor NT7 turns on in response to the clock signal CK, the second terminal of the third NMOS transistor NT3 may be connected to the sixth node N6. In some example embodiments, the second terminal of the seventh NMOS transistor NT7 may alternatively be connected to the low power voltage GND instead of the sixth node N6. Although it is illustrated in FIGS. 1A and 1B that the third NMOS transistor NT3 is connected to the first node N1 and the seventh NMOS transistor NT7 is connected to the sixth node N6, positions of the third NMOS transistor NT3 and the seventh NMOS transistor NT7 may be changed with each other in some example embodiments. That is, the third NMOS transistor NT3 may alternatively be connected to the sixth node N6, and the seventh NMOS transistor NT7 may alternatively be connected to the first node N1. The sixth NMOS transistor NT6 and the eighth NMOS transistor NT8 may be connected in series between the second node N2 and the fifth node N5. Specifically, the sixth NMOS transistor NT6 may include a first terminal that is connected to the second node N2, a second terminal that is connected to a first terminal of the eighth NMOS transistor NT8, and a gate terminal that is connected to the first node N1. Thus, when the sixth NMOS transistor NT6 turns on in response to a voltage signal of the first node N1, the first terminal of the eighth NMOS transistor NT8 may be connected to the second node N2. The eighth NMOS transistor NT8 may include the first terminal that is connected to the second terminal of the sixth NMOS transistor NT6, a second terminal that is connected to the fifth node N5, and a gate terminal that receives the clock signal CK. Thus, when the eighth NMOS transistor NT8 turns on in response to the clock signal CK, the second terminal of the sixth NMOS transistor NT6 may be connected to the fifth node N5. In some example embodiments, the second terminal of the eighth NMOS transistor NT8 may alternatively be connected to the low power voltage GND instead of the fifth node N5. Although it is illustrated in FIGS. 1A and 1B that the sixth NMOS transistor NT6 is connected to the second node N2 and the eighth NMOS transistor NT8 is connected to the fifth node N5, positions of the sixth NMOS transistor NT6 and the eighth NMOS transistor NT8 may be changed with each other in some example embodiments. That is, the eighth NMOS transistor NT8 may alternatively be connected to the second node N2, and the sixth NMOS transistor NT6 may alternatively be connected to the fifth node N5. As described above, an internal node that is charged by the inverted input data DN (e.g., the first node N1) may be connected to the gate terminal of the sixth NMOS transistor NT6 included in a right structure, and an internal node that is charged by the input data D (e.g., the second node N2) may be connected to the gate terminal of the third NMOS transistor NT3 included in a left structure. That is, the internal node that is charged by the inverted input data DN (e.g., the first node N1) and the internal node that is charged by the input data D (e.g., the second node N2) are cross-connected, so that the internal nodes (e.g., the first node N1 and the second node N2) may complementarily operate. Thus, node-values of the internal nodes (e.g., the first node N1 and the second node N2) are complementarily determined, so that the internal nodes (e.g., the first node N1 and the second node N2) may not be repeatedly charged and discharged in response to the clock signal CK while the input data D is not changed. In addition, the internal node that is charged by the inverted input data DN (e.g., the sixth node N6) and the internal node that is charged by the input data D (e.g., the fifth node N5) are cross-connected, so that the internal nodes (e.g., the sixth node N6 and the fifth node N5) may complementarily operate. Thus, node-values of the internal nodes (e.g., the sixth node N6 and the fifth node N5) are complementarily determined, so that the internal nodes (e.g., the sixth node N6 and the fifth node N5) may not be repeatedly charged and discharged in response to the clock signal CK while the input data D is not changed. As a result, the flip-flop 100 may prevent unnecessary power consumption while the input data D is not changed, and thus may operate with low power.

The inverter circuit 160 may be connected between the sixth node N6 and an output node OUT. Thus, the inverter circuit 160 may invert a voltage signal of the sixth node N6 (e.g., the inverted input data DN) to output the output data Q (e.g., the input data D latched at the rising edges of the clock signal CK) at the output node OUT. In an example embodiment, the inverter circuit 160 may include an eleventh PMOS transistor PT11 and an eleventh NMOS transistor NT11. The eleventh PMOS transistor PT11 may include a first terminal that is connected to the high power voltage VDD, a second terminal that is connected to the output node OUT, and a gate terminal that is connected to the sixth node N6. Thus, when the eleventh PMOS transistor PT11 turns on in response to a voltage signal of the sixth node N6, the high power voltage VDD may be applied to the output node OUT. The eleventh NMOS transistor NT11 may include a first terminal that is connected to the output node OUT, a second terminal that is connected to the low power voltage GND, and a gate terminal that is connected to the sixth node N6. Thus, when the eleventh NMOS transistor NT11 turns on in response to a voltage signal of the sixth node N6, the low power voltage GND may be applied to the output node OUT. In this regard, an operation of the flip-flop 100 will be described based on a structure of the flip-flop 200 which includes transistors that perform an assistant operation such as a keeper element that performs data retention with reference to FIGS. 4 through 5B. In other words, except that the flip-flop 100 does not include the transistors that perform the assistant operation, the operation of the flip-flop 100 is substantially the same as an operation of the flip-flop 200.

In some example embodiments, the flip-flop 100 may be implemented (or, expressed) by logic elements. Specifically, the flip-flop 100 may include a first OR-gate element OR1, a first NAND-gate element NAND1, a first inverter element INV1, a second OR-gate element OR2, a second NAND-gate element NAND2, a third AND-gate element AND3, a first NOR-gate element NOR1, a fourth AND-gate element AND4, and a second NOR-gate element NOR2. Here, the first OR-gate element OR1 and the first NAND-gate element NAND1 may be implemented by one OR-AND-INVERTER-gate element, and the second OR-gate element OR2 and the second NAND-gate element NAND2 may be implemented by one OR-AND-INVERTER-gate element. In addition, the third AND-gate element AND3 and the first NOR-gate element NOR1 may be implemented by one AND-OR-INVERTER-gate element, and the fourth AND-gate element AND4 and the second NOR-gate element NOR2 may be implemented by one AND-OR-INVERTER-gate element. In some example embodiments, the flip-flop 100 may further include a second inverter element INV2. The first OR-gate element OR1 may include a first input terminal that receives the clock signal CK, a second input terminal that receives the input data D, and an output terminal that outputs an OR-operation result between the clock signal CK and the input data D. The first NAND-gate element NAND1 may include a first input terminal that is connected to the output terminal of the first OR-gate element OR1, a second input terminal that is connected to the second node N2, and an output terminal (e.g., the first node N1) that outputs a NAND-operation result between the OR-operation result of the first OR-gate element OR1 and a voltage signal of the second node N2. The first inverter element INV1 may be connected between the second input terminal of the first OR-gate element OR1 and the first input terminal of the second OR-gate element OR2. The first inverter element INV1 may invert the input data D to output the inverted input data DN. The second OR-gate element OR2 may include a first input terminal that receives the inverted input data DN, a second input terminal that receives the clock signal CK, and the output terminal that outputs an OR-operation result between the inverted input data DN and the clock signal CK. The second NAND-gate element NAND2 may include a first input terminal that is connected to the first node N1, a second input terminal that is connected to the output terminal of the second OR-gate element OR2, and an output terminal (e.g., the second node N2) that outputs a NAND-operation result between a voltage signal of the first node N1 and the OR-operation result of the second OR-gate element OR2. The third AND-gate element AND3 may include a first input terminal that is connected to the first node N1, a second input terminal that receives the clock signal CK, a third input terminal that receives the inverted input data DN, and an output terminal that outputs an AND-operation result among the inverted input data DN, the clock signal CK, and a voltage signal of the first node N1. In some example embodiments, the third AND-gate element AND3 may not receive the inverted input data DN. In this case, the third AND-gate element AND3 may include a first input terminal that is connected to the first node N1, a second input terminal that receives the clock signal CK, and an output terminal that outputs an AND-operation result between the clock signal CK and a voltage signal of the first node N1. However, the AND-operation result between the clock signal CK and the voltage signal of the first node N1 may be the same as the AND-operation result among the inverted input data DN, the clock signal CK, and the voltage signal of the first node N1. The first NOR-gate element NOR1 may include a first input terminal that is connected to the output terminal of the third AND-gate element AND3, a second input terminal that is connected to the sixth node N6, and an output terminal (e.g., the fifth node N5) that outputs a NOR-operation result between the AND-operation result of the third AND-gate element AND3 and a voltage signal of the sixth node N6. The fourth AND-gate element AND4 may include a first input terminal that is connected to the second node N2, a second input terminal that receives the clock signal CK, a third input terminal that receives the input data D, and an output terminal that outputs an AND-operation result among a voltage signal of the second node N2, the clock signal CK, and the input data D. In some example embodiments, the fourth AND-gate element AND4 may not receive the input data D. In this case, the fourth AND-gate element AND4 may include a first input terminal that is connected to the second node N2, a second input terminal that receives the clock signal CK, and an output terminal that outputs an AND-operation result between a voltage signal of the second node N2 and the clock signal CK. However, the AND-operation result between the voltage signal of the second node N2 and the clock signal CK may be the same as the AND-operation result among the voltage signal of the second node N2, the clock signal CK, and the input data D. The second NOR-gate element NOR2 may include a first input terminal that is connected to the fifth node N5, a second input terminal that is connected to the output terminal of the fourth AND-gate element AND4, and an output terminal (e.g., the sixth node N6) that outputs a NOR-operation result between a voltage signal of the fifth node N5 and an AND-operation result of the fourth AND-gate element AND4. The second inverter element INV2 may be connected between the sixth node N6 and the output node OUT. The second inverter element INV2 may invert the voltage signal of the sixth node N6 to output the output data Q. In this regard, an operation of the flip-flop 100 will be described based on a structure of the flip-flop 200 which includes logic elements that perform an assistant operation such as a keeper element that performs data retention with reference to FIGS. 6 through 7B. In other words, except that the flip-flop 100 does not include the logic elements that perform the assistant operation, the operation of the flip-flop 100 is substantially the same as an operation of the flip-flop 200.

As described above, the flip-flop 100 may latch the input data D at the rising edges of the clock signal CK and may output the latched input data D as the output data Q at the output node OUT. For example, as illustrated in FIG. 3, the flip-flop 100 may latch the input data D at a rising edge of the clock signal CK (e.g., indicated by TIA) and may output the latched input data D as the output data Q. Here, since the latched input data D has a logic 'low' level, the flip-flop 100 may output the output data Q having a logic 'low' level. The output data Q output from the flip-flop 100 may not be changed until a next rising edge of the clock signal CK because the flip-flop 100 is triggered at only rising edges of the clock signal CK. Next, the flip-flop 100 may latch the input data D at the next rising edge of the clock signal CK (e.g., indicated by TIB) and may output the latched input data D as the output data Q. Here, since the latched input data D has a logic 'high' level, the flip-flop 100 may output the output data Q having a logic 'high' level. That is, the output data Q output from the flip-flop 100 may be changed from a logic 'low' level to a logic 'high' level. Subsequently, the flip-flop 100 may latch the input data D at a next rising edge of the clock signal CK (e.g., indicated by TIC) and may output the latched input data D as the output data Q. Here, since the latched input data D has a logic 'high' level, the flip-flop 100 may output the output data Q having a logic 'high' level. That is, the output data Q output from the flip-flop 100 may be maintained to have a logic 'high' level. Next, the flip-flop 100 may latch the input data D at a next rising edge of the clock signal CK (e.g., indicated by TID) and may output the latched input data D as the output data Q. Here, since the latched input data D has a logic 'low' level, the flip-flop 100 may output the output data Q having a logic 'low' level. That is, the output data Q output from the flip-flop 100 may be changed from a logic 'high' level to a logic 'low' level. Subsequently, the flip-flop 100 may latch the input data D at a next rising edge of the clock signal CK (e.g., indicated by TIE) and may output the latched input data D as the output data Q. Here, since the latched input data D has a logic 'low' level, the flip-flop 100 may output the output data Q having a logic 'low' level. That is, the output data Q output from the flip-flop 100 may be maintained to have a logic 'low' level. Next, the flip-flop 100 may latch the input data D at a next rising edge of the clock signal CK (e.g., indicated by TIF) and may output the latched input data D as the output data Q. Here, since the latched input data D has a logic 'high' level, the flip-flop 100 may output the output data Q having a logic 'high' level. That is, the output data Q output from the flip-flop 100 may be changed from a logic 'low' level to a logic 'high' level. Subsequently, the flip-flop 100 may latch the input data D at a next rising edge of the clock signal CK (e.g., indicated by TIG) and may output the latched input data D as the output data Q. Here, since the latched input data D has a logic 'high' level, the flip-flop 100 may output the output data Q having a logic 'high' level. That is, the output data Q output from the flip-flop 100 may be maintained to have a logic 'high' level.

In an example embodiment, the flip-flop 100 may include a reset function that resets the output data Q to have a logic 'low' level. In this case, the flip-flop 100 may receive a reset signal and may reset the output data Q to have a logic 'low' level when the reset signal has a logic 'high' level. In another example embodiment, the flip-flop 100 may include a set function that sets the output data Q to have a logic 'high' level. In this case, the flip-flop 100 may receive a set signal and may set the output data Q to have a logic 'high' level when the set signal has a logic 'high' level. In still another example embodiment, the flip-flop 100 may include both a reset function that resets the output data Q to have a logic 'low' level and a set function that sets the output data Q to have a logic 'high' level. In this case, the flip-flop 100 may receive a reset signal and a set signal, may reset the output data Q to have a logic 'low' level when the reset signal has a logic 'high' level, and may set the output data Q to have a logic 'high' level when the set signal has a logic 'high' level. In some example embodiments, the flip-flop 100 may further include a retention function that performs the data retention. Since a conventional master-slave flip-flop includes an internal node that is repeatedly charged and discharged in response to the clock signal CK, the conventional master-slave flip-flop consumes power even while the input data D is not changed. Thus, the conventional master-slave flip-flop cannot satisfy the low power level that a recent mobile device of which an operating frequency is relatively high requires. On the other hand, the flip-flop 100 may include the internal node that is charged by the inverted input data DN and the internal node that is charged by the input data D, where the internal nodes of the flip-flop 100 complementarily operate (e.g., the node-values of the internal nodes of the flip-flop 100 are complementarily determined) because the internal nodes of the flip-flop 100 are cross-connected, so that the flip-flop 100 may prevent unnecessary power consumption while the input data D is not changed. Thus, the flip-flop 100 may operate with low power. That is, the internal nodes (e.g., the first node N1 and the second node N2) of the flip-flop 100 may be prevented from being repeatedly charged and discharged in response to the clock signal CK while the input data D is not changed. In addition, the internal nodes (e.g., the fifth node N5 and the sixth node N6) of the flip-flop 100 may be prevented from being repeatedly charged and discharged in response to the clock signal CK while the input data D is not changed. For this reason, the flip-flop 100 may satisfy the low power level that a recent mobile device of which an operating frequency is relatively high requires because the flip-flop 100 can consume much less power than the conventional master-slave flip-flop as an operating frequency (e.g., a frequency of the clock signal CK) increases. As a result, the flip-flop 100 may operate with low power compared to the conventional master-slave flip-flop, so that the flip-flop 100 may be applied to various low-power and high-performance chips that constitute a low-power and high-performance mobile device.

Figure 4:
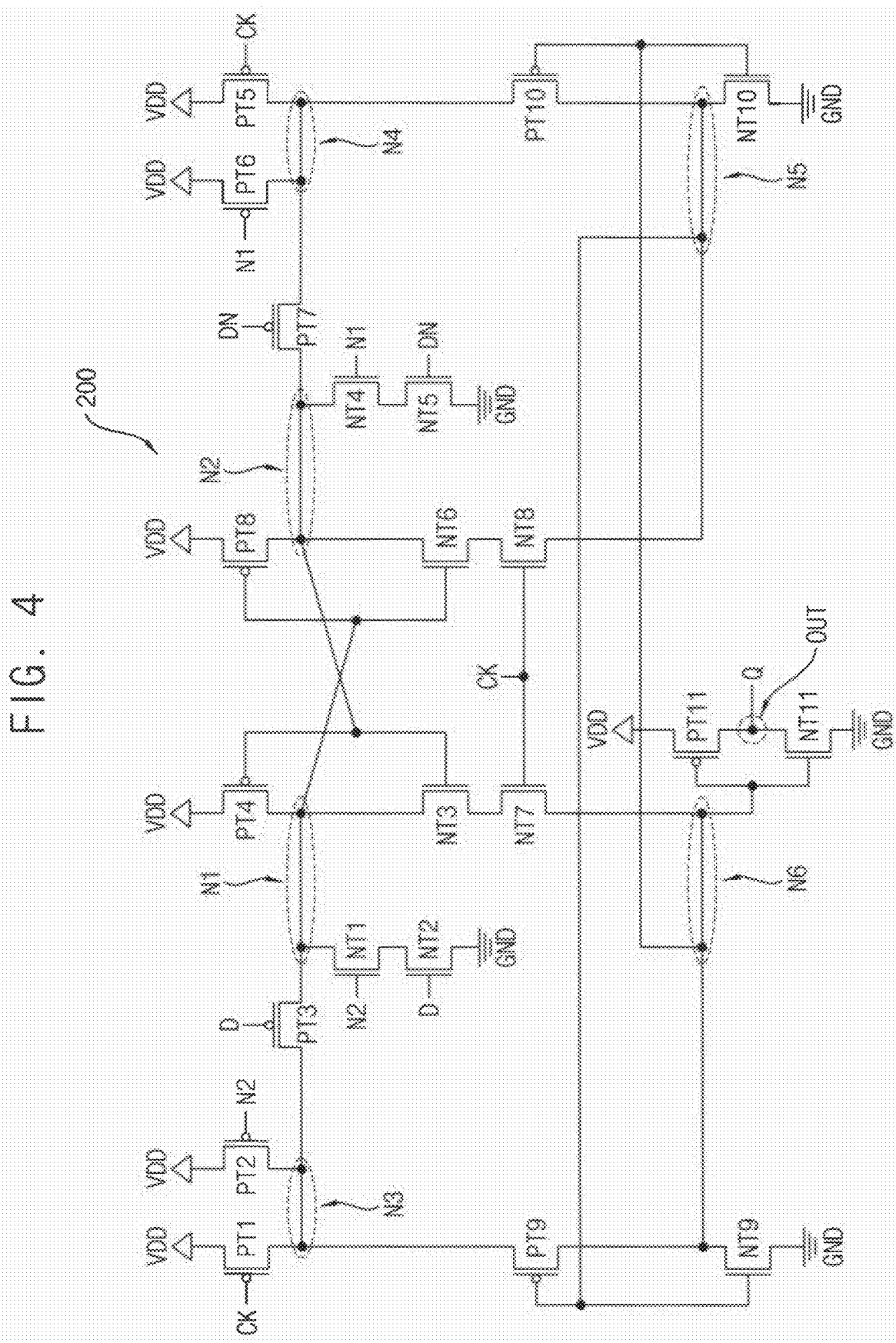
FIG. 4 is a circuit diagram illustrating a flip-flop according to some example embodiments.
Figure 5A:
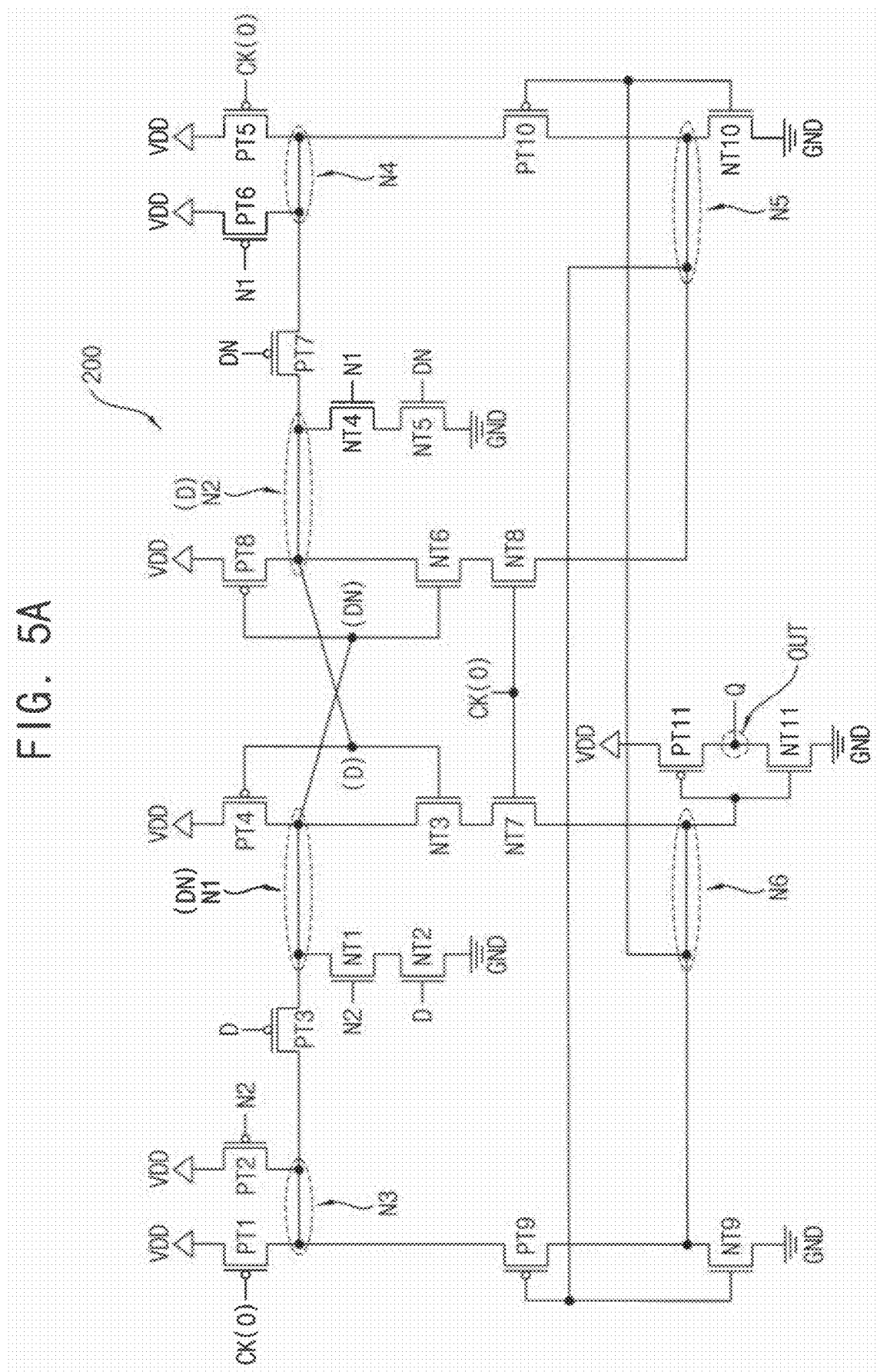
FIGS. 5A and 5B are diagrams for describing an operation of the flip-flop of FIG. 4.
Figure 5B:
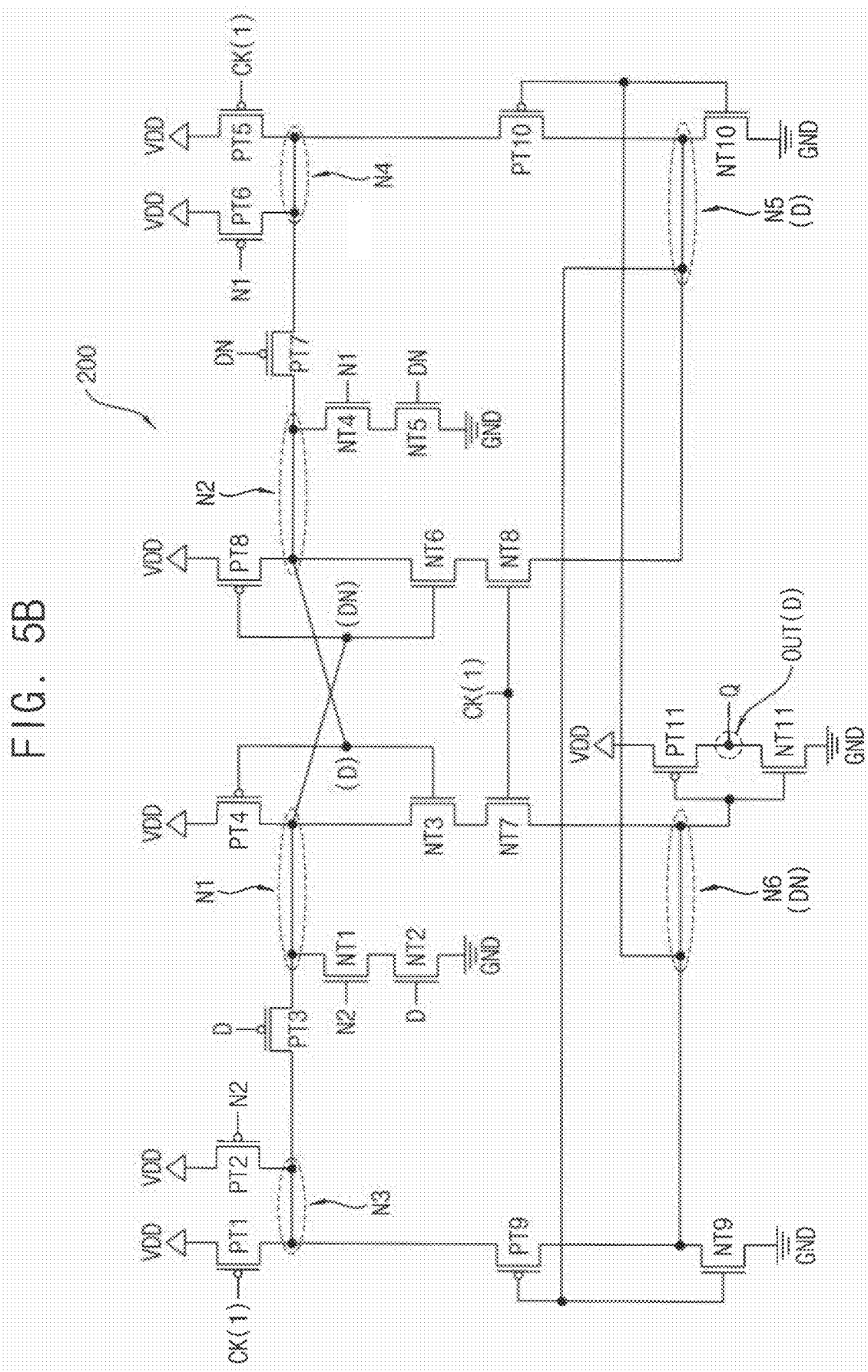

FIG. 4 is a circuit diagram illustrating a flip-flop according to some example embodiments. FIGS. 5A and 5B are diagrams for describing an operation of the flip-flop of FIG. 4.

Referring to FIGS. 4 through 5B, the flip-flop 200 may include first through eleventh PMOS transistors PT1 through PT11 and first through eleventh NMOS transistors NT1 through NT11.

The first PMOS transistor PT1 may include a first terminal that is connected to the high power voltage VDD, a second terminal that is connected to the third node N3, and a gate terminal that receives the clock signal CK. Thus, when the first PMOS transistor PT1 turns on in response to the clock signal CK, the high power voltage VDD may be applied to the third node N3. The second PMOS transistor PT2 may include a first terminal that is connected to the high power voltage VDD, a second terminal that is connected to the third node N3, and a gate terminal that is connected to the second node N2. Thus, when the second PMOS transistor PT2 turns on in response to a voltage signal of the second node N2, the high power voltage VDD may be applied to the third node N3. The third PMOS transistor PT3 may include a first terminal that is connected to the third node N3, a second terminal that is connected to the first node N1, and a gate terminal that receives the input data D. Thus, when the third PMOS transistor PT3 turns on in response to the input data D, the third node N3 may be connected to the first node N1. The first NMOS transistor NT1 and the second NMOS transistor NT2 may be connected in series between the first node N1 and the low power voltage GND. For example, the low power voltage GND may be a ground voltage. In an example embodiment, as illustrated in FIG. 4, the first NMOS transistor NT1 may include a first terminal that is connected to the first node N1, a second terminal that is connected to a first terminal of the second NMOS transistor NT2, and a gate terminal that is connected to the second node N2. The second NMOS transistor NT2 may include the first terminal that is connected to the second terminal of the first NMOS transistor NT1, a second terminal that is connected to the low power voltage GND, and a gate terminal that receives the input data D. In this case, when the first NMOS transistor NT1 turns on in response to a voltage signal of the second node N2 and when the second NMOS transistor NT2 turns on in response to the input data D, the low power voltage GND may be applied to the first node N1. In another example embodiment, the first NMOS transistor NT1 may include a first terminal that is connected to the first node N1, a second terminal that is connected to a first terminal of the second NMOS transistor NT2, and a gate terminal that receives the input data D. The second NMOS transistor NT2 may include the first terminal that is connected to the second terminal of the first NMOS transistor NT1, a second terminal that is connected to the low power voltage GND, and a gate terminal that is connected to the second node N2. In this case, when the first NMOS transistor NT1 turns on in response to the input data D and when the second NMOS transistor NT2 turns on in response to a voltage signal of the second node N2, the low power voltage GND may be applied to the first node N1. The fourth PMOS transistor PT4 may include a first terminal that is connected to the high power voltage VDD, a second terminal that is connected to the first node N1, and a gate terminal that is connected to the second node N2. Thus, when the fourth PMOS transistor PT4 turns on in response to a voltage signal of the second node N2, the high power voltage VDD may be applied to the first node N1. The third NMOS transistor NT3 may include a first terminal that is connected to the first node N1, a second terminal that is connected to a first terminal of the seventh NMOS transistor NT7, and a gate terminal that is connected to the second node N2. Thus, when the third NMOS transistor NT3 turns on in response to a voltage signal of the second node N2, the first terminal of the seventh NMOS transistor NT7 may be connected to the first node N1.

The fifth PMOS transistor PT5 may include a first terminal that is connected to the high power voltage VDD, a second terminal that is connected to the fourth node N4, and a gate terminal that receives the clock signal CK. Thus, when the fifth PMOS transistor PT5 turns on in response to the clock signal CK, the high power voltage VDD may be applied to the fourth node N4. The sixth PMOS transistor PT6 may include a first terminal that is connected to the high power voltage VDD, a second terminal that is connected to the fourth node N4, and a gate terminal that is connected to the first node N1. Thus, when the sixth PMOS transistor PT6 turns on in response to a voltage signal of the first node N1, the high power voltage VDD may be applied to the fourth node N4. The seventh PMOS transistor PT7 may include a first terminal that is connected to the fourth node N4, a second terminal that is connected to the second node N2, and a gate terminal that receives the inverted input data DN (e.g., data generated by inverting the input data D). Thus, when the seventh PMOS transistor PT7 turns on in response to the inverted input data DN, the fourth node N4 may be connected to the second node N2. The fourth NMOS transistor NT4 and the fifth NMOS transistor NT5 may be connected in series between the second node N2 and the low power voltage GND. In an example embodiment, as illustrated in FIG. 4, the fourth NMOS transistor NT4 may include a first terminal that is connected to the second node N2, a second terminal that is connected to a first terminal of the fifth NMOS transistor NT5, and a gate terminal that is connected to the first node N1. The fifth NMOS transistor NT5 may include the first terminal that is connected to the second terminal of the fourth NMOS transistor NT4, a second terminal that is connected to the low power voltage GND, and a gate terminal that receives the inverted input data DN. In this case, when the fourth NMOS transistor NT4 turns on in response to a voltage signal of the first node N1 and when the fifth NMOS transistor NT5 turns on in response to the inverted input data DN, the low power voltage GND may be applied to the second node N2. In another example embodiment, the fourth NMOS transistor NT4 may include a first terminal that is connected to the second node N2, a second terminal that is connected to a first terminal of the fifth NMOS transistor NT5, and a gate terminal that receives the inverted input data DN. The fifth NMOS transistor NT5 may include the first terminal that is connected to the second terminal of the fourth NMOS transistor NT4, a second terminal that is connected to the low power voltage GND, and a gate terminal that is connected to the first node N1. In this case, when the fourth NMOS transistor NT4 turns on in response to the inverted input data DN and when the fifth NMOS transistor NT5 turns on in response to a voltage signal of the first node N1, the low power voltage GND may be applied to the second node N2. The eighth PMOS transistor PT8 may include a first terminal that is connected to the high power voltage VDD, a second terminal that is connected to the second node N2, and a gate terminal that is connected to the first node N1. Thus, when the eighth PMOS transistor PT8 turns on in response to a voltage signal of the first node N1, the high power voltage VDD may be applied to the second node N2. The sixth NMOS transistor NT6 may include a first terminal that is connected to the second node N2, a second terminal that is connected to a first terminal of the eighth NMOS transistor NT8, and a gate terminal that is connected to the first node N1. Thus, when the sixth NMOS transistor NT6 turns on in response to a voltage signal of the first node N1, the first terminal of the eighth NMOS transistor NT8 may be connected to the second node N2.

The seventh NMOS transistor NT7 may include a first terminal that is connected to a second terminal of the third NMOS transistor NT3, a second terminal that is connected to the sixth node N6, and a gate terminal that receives the clock signal CK. Thus, when the seventh NMOS transistor NT7 turns on in response to the clock signal CK, the second terminal of the third NMOS transistor NT3 may be connected to the sixth node N6. The ninth PMOS transistor PT9 may include a first terminal that is connected to the third node N3, a second terminal that is connected to the sixth node N6, and a gate terminal that is connected to the fifth node N5. Thus, when the ninth PMOS transistor PT9 turns on in response to a voltage signal of the fifth node N5, the third node N3 may be connected to the sixth node N6. The ninth NMOS transistor NT9 may include a first terminal that is connected to the sixth node N6, a second terminal that is connected to the low power voltage GND, and a gate terminal that is connected to the fifth node N5. Thus, when the ninth NMOS transistor NT9 turns on in response to a voltage signal of the fifth node N5, the low power voltage GND may be applied to the sixth node N6. The eighth NMOS transistor NT8 may include a first terminal that is connected to a second terminal of the sixth NMOS transistor NT6, a second terminal that is connected to the fifth node N5, and a gate terminal that receives the clock signal CK. Thus, when the eighth NMOS transistor NT8 turns on in response to the clock signal CK, the second terminal of the sixth NMOS transistor NT6 may be connected to the fifth node N5. The tenth PMOS transistor PT10 may include a first terminal that is connected to the fourth node N4, a second terminal that is connected to the fifth node N5, and a gate terminal that is connected to the sixth node N6. Thus, when the tenth PMOS transistor PT10 turns on in response to a voltage signal of the sixth node N6, the fourth node N4 may be connected to the fifth node N5. The tenth NMOS transistor NT10 may include a first terminal that is connected to the fifth node N5, a second terminal that is connected to the low power voltage GND, and a gate terminal that is connected to the sixth node N6. Thus, when the tenth NMOS transistor NT10 turns on in response to a voltage signal of the sixth node N6, the low power voltage GND may be applied to the fifth node N5. The eleventh PMOS transistor PT11 may include a first terminal that is connected to the high power voltage VDD, a second terminal that is connected to the output node OUT, and a gate terminal that is connected to the sixth node N6. Thus, when the eleventh PMOS transistor PT11 turns on in response to a voltage signal of the sixth node N6, the high power voltage VDD may be applied to the output node OUT. The eleventh NMOS transistor NT11 may include a first terminal that is connected to the output node OUT, a second terminal that is connected to the low power voltage GND, and a gate terminal that is connected to the sixth node N6. Thus, when the eleventh NMOS transistor NT11 turns on in response to a voltage signal of the sixth node N6, the low power voltage GND may be applied to the output node OUT. In other words, the eleventh PMOS transistor PT11 and the eleventh NMOS transistor NT11 constitute an inverter circuit, and thus an inverted voltage signal (e.g., a voltage signal generated by inverting a voltage signal of the sixth node N6) may be output as the output data Q at the output node OUT.

Based on the above structure, the flip-flop 200 may latch the input data D at the rising edges of the clock signal CK and may output the latched input data D as the output data Q at the output node OUT. Specifically, as illustrated in FIG. 5A, when the clock signal CK has a logic 'low' level (e.g., indicated by 0), a voltage signal of the third node N3 may have a logic 'high' level (e.g., indicated by 1) due to the high power voltage VDD. Here, since the third PMOS transistor PT3 turns on or off in response to the input data D, a voltage signal of the first node N1 may have a logic level corresponding to the inverted input data DN. For example, when the input data D has a logic 'low' level, the first NMOS transistor NT1 and the second NMOS transistor NT2 may turn off, and the third PMOS transistor PT3 may turn on. Thus, a voltage signal of the third node N3 (e.g., the high power voltage VDD) may be applied to the first node N1, and thus a voltage signal of the first node N1 may have a logic 'high' level. On the other hand, when the input data D has a logic 'high' level, the first NMOS transistor NT1 and the second NMOS transistor NT2 may turn on, and the third PMOS transistor PT3 may turn off. Thus, the low power voltage GND may be applied to the first node N1, and thus a voltage signal of the first node N1 may have a logic 'low' level. In other words, since a voltage signal of the first node N1 is opposite to a logic level of the input data D, a voltage signal of the first node N1 may have a logic level corresponding to the inverted input data DN. In addition, when the clock signal CK has a logic 'low' level, a voltage signal of the fourth node N4 may have a logic 'high' level due to the high power voltage VDD. Here, since the seventh PMOS transistor PT7 turns on or off in response to the inverted input data DN, a voltage signal of the second node N2 may have a logic level corresponding to the input data D. For example, when the inverted input data DN has a logic 'low' level, the fourth NMOS transistor NT4 and the fifth NMOS transistor NT5 may turn off, and the seventh PMOS transistor PT7 may turn on. Thus, a voltage signal of the fourth node N4 (e.g., the high power voltage VDD) may be applied to the second node N2, and thus a voltage signal of the second node N2 may have a logic 'high' level. On the other hand, when the inverted input data DN has a logic 'high' level, the fourth NMOS transistor NT4 and the fifth NMOS transistor NT5 may turn on, and the seventh PMOS transistor PT7 may turn off. Thus, the low power voltage GND may be applied to the second node N2, and thus a voltage signal of the second node N2 may have a logic 'low' level. In other words, since a voltage signal of the second node N2 is opposite to a logic level of the inverted input data DN, a voltage signal of the second node N2 may have a logic level corresponding to the input data D. Here, since the clock signal CK has a logic 'low' level, the seventh NMOS transistor NT7 and the ninth NMOS transistor NT9 may turn off. Thus, a voltage signal of the first node N1 may maintain a logic level corresponding to the inverted input data DN, and a voltage signal of the second node N2 may maintain a logic level corresponding to the input data D.

Subsequently, as illustrated in FIG. 5B, when the clock signal CK is changed from a logic 'low' level to a logic 'high' level (e.g., a rising edge of the clock signal CK), the seventh NMOS transistor NT7 and the eighth NMOS transistor NT8 may turn on. Thus, a voltage signal of the fifth node N5 may have a logic level corresponding to the input data D, and a voltage signal of the sixth node N6 may have a logic level corresponding to the inverted input data DN. That is, since a voltage signal of the first node N1 (e.g., the inverted input data DN) and a voltage signal of the second node N2 (e.g., the input data D) are transferred to the sixth node N6 and the fifth node N5 via the seventh NMOS transistor NT7 and the eighth NMOS transistor NT8, respectively, a voltage signal of the sixth node N6 may have a logic level corresponding to the inverted input data DN, and a voltage signal of the fifth node N5 may have a logic level corresponding to the input data D. In other words, the input data D and the inverted input data DN may be latched at the fifth node N5 and the sixth node N6, respectively. Here, since the eleventh PMOS transistor PT11 and the eleventh NMOS transistor NT11 operate as the inverter circuit, a voltage signal of the output node OUT may be a voltage signal generated by inverting a voltage signal of the sixth node N6, and thus a voltage signal of the output node OUT may have a logic level corresponding to the input data D. That is, the input data D latched at the rising edges of the clock signal CK may be output as the output data Q at the output node OUT. As described above, when the flip-flop 200 performs the above operation, the first node N1 of the left structure and the second node N2 of the right structure may be cross-connected, so that the first node N1 of the left structure and the second node N2 of the right structure may complementarily operate (e.g., a node-value of the first node N1 of the left structure and a node-value of the second node N2 of the right structure may be complementarily determined). Thus, the first node N1 of the left structure and the second node N2 of the right structure may be prevented from being repeatedly charged and discharged in response to the clock signal CK while the input data D is not changed. In addition, when the flip-flop 200 performs the above operation, the sixth node N6 of the left structure and the fifth node N5 of the right structure may be cross-connected, so that the sixth node N6 of the left structure and the fifth node N5 of the right structure may complementarily operate (e.g., a node-value of the sixth node N6 of the left structure and a node-value of the fifth node N5 of the right structure may be complementarily determined). Thus, the sixth node N6 of the left structure and the fifth node N5 of the right structure may be prevented from being repeatedly charged and discharged in response to the clock signal CK while the input data D is not changed. That is, cross-connected internal nodes of the flip-flop 200 (e.g., a pair of the first node N1 and the second node N2 and a pair of the fifth node N5 and the sixth node N6) may complementarily operate (e.g., the node-values of the cross-connected internal nodes may be complementarily determined), so that the cross-connected internal nodes of the flip-flop 200 may be prevented from being repeatedly charged and discharged in response to the clock signal CK while the input data D is not changed. Thus, the flip-flop 200 may prevent unnecessary power consumption while the input data D is not changed. As a result, the flip-flop 200 may operate with low power.

Figure 6:
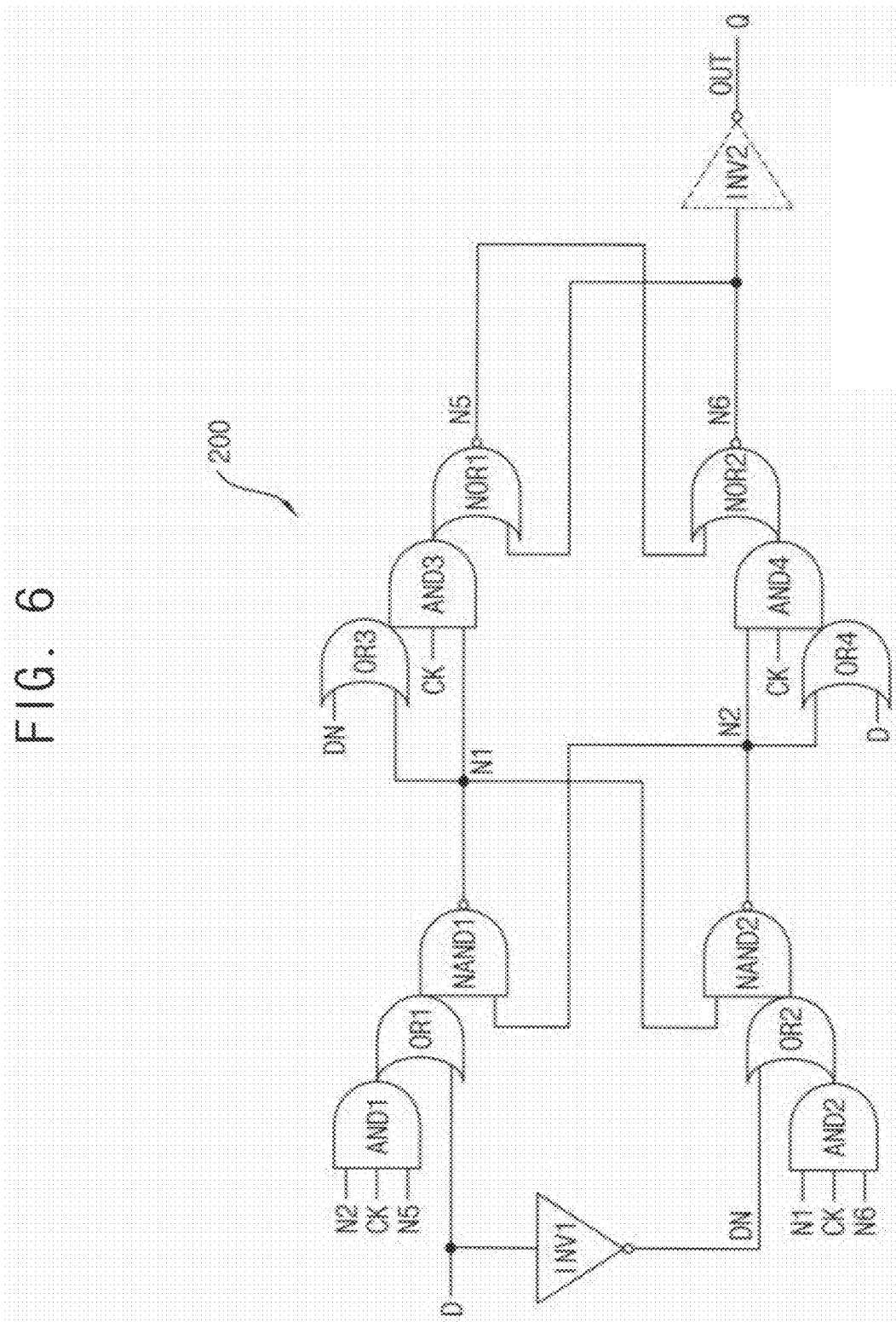
FIG. 6 is a block diagram illustrating an example in which the flip-flop of FIG. 4 is implemented by logic elements.
Figure 7A:
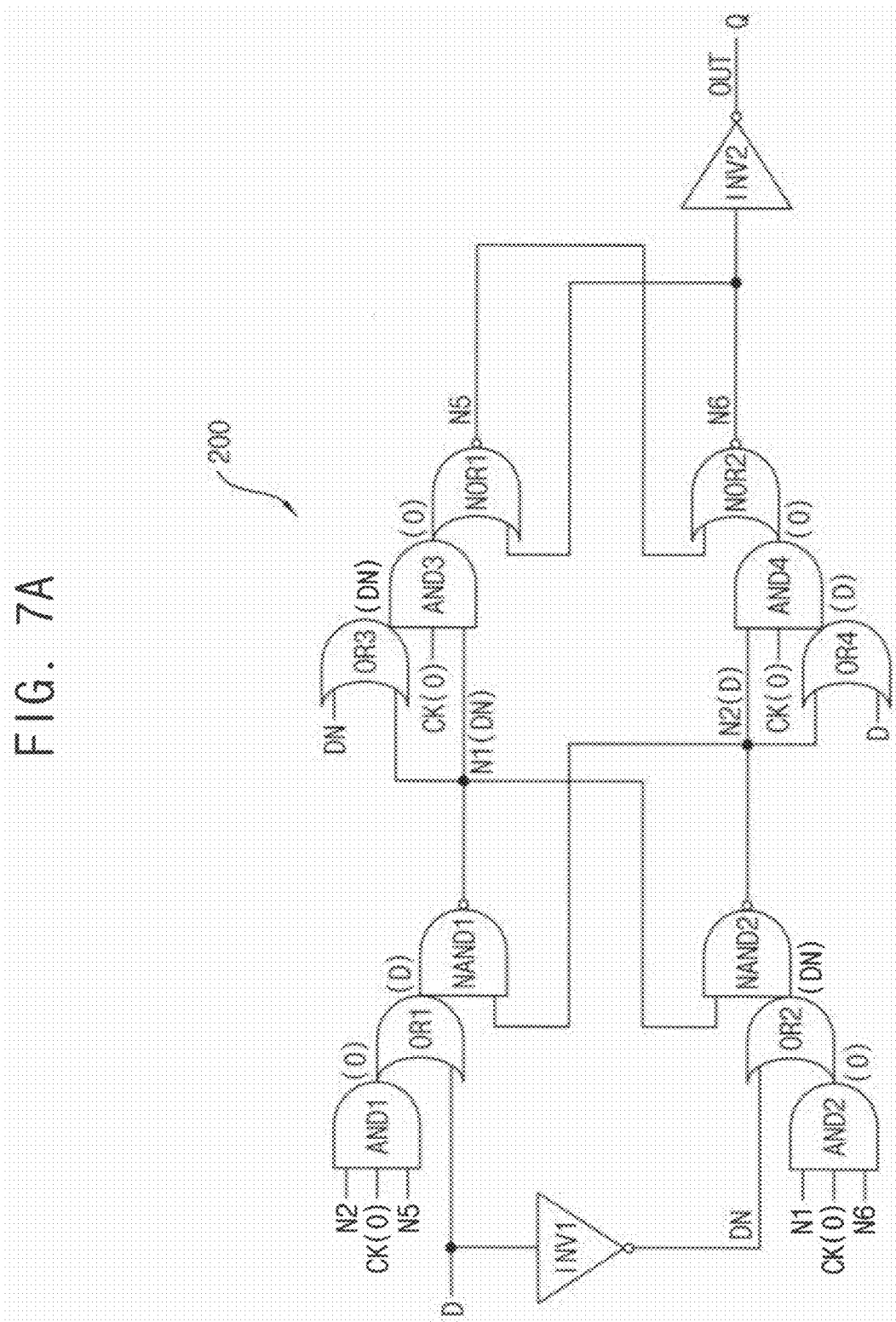
FIGS. 7A and 7B are diagrams for describing an operation of the flip-flop of FIG. 6.
Figure 7B:
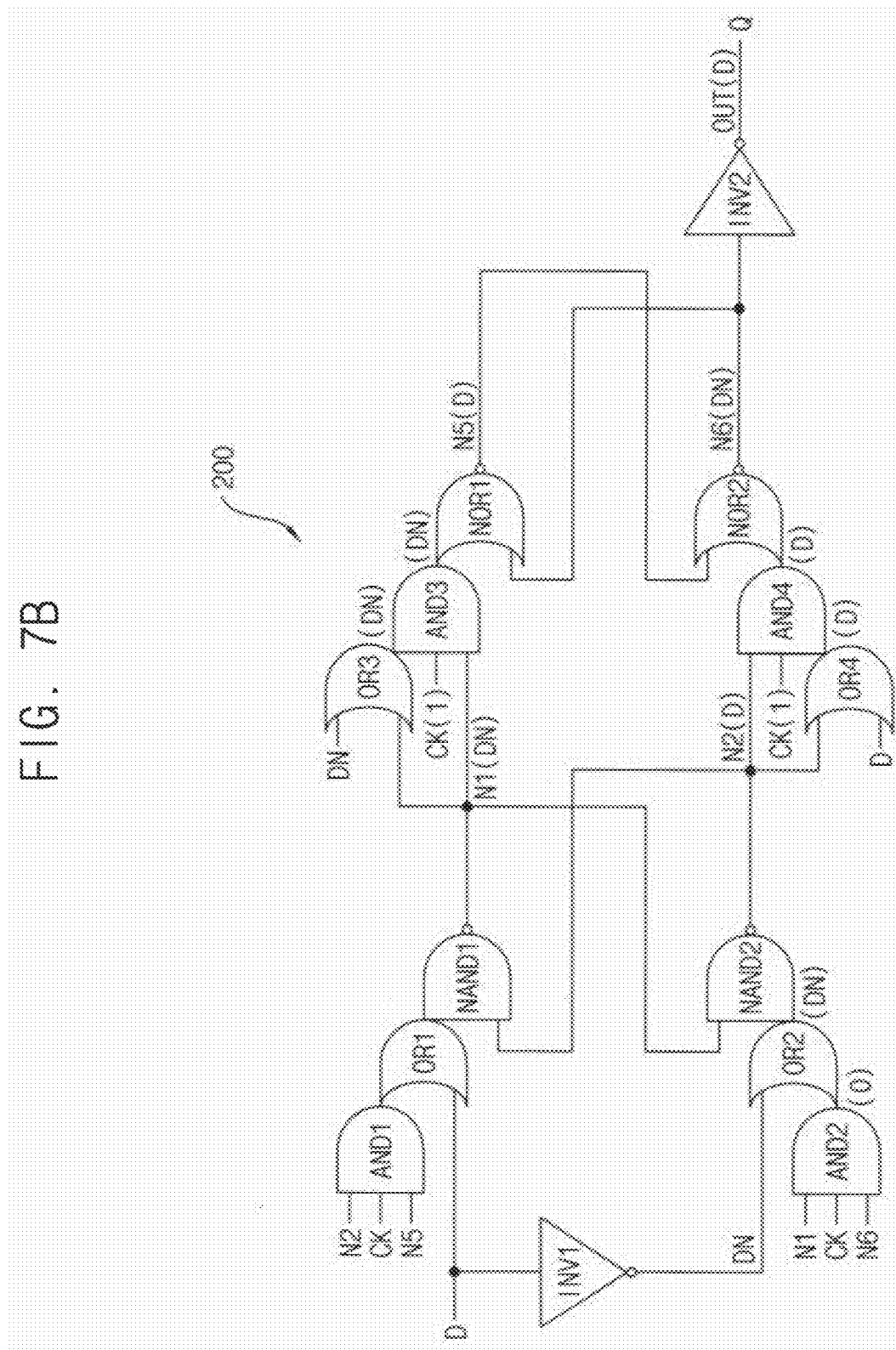

FIG. 6 is a block diagram illustrating an example in which the flip-flop of FIG. 4 is implemented by logic elements. FIGS. 7A and 7B are diagrams for describing an operation of the flip-flop of FIG. 6.

Referring to FIGS. 6 through 7B, the flip-flop 200 may include a first AND-gate element AND1, a first OR-gate element OR1, a first NAND-gate element NAND1, a first inverter element INV1, a second AND-gate element AND2, a second OR-gate element OR2, a second NAND-gate element NAND2, a third OR-gate element OR3, a third AND-gate element AND3, a first NOR-gate element NOR1, a fourth OR-gate element OR4, a fourth AND-gate element AND4, and a second NOR-gate element OR2. In some example embodiments, the flip-flop 200 may further include a second inverter element INV2.

The first AND-gate element AND1 may include a first input terminal that is connected to the second node N2, a second input terminal that receives the clock signal CK, a third input terminal that is connected to the fifth node N5, and an output terminal that outputs an AND-operation result among a voltage signal of the second node N2, the clock signal CK, and a voltage signal of the fifth node N5. The first OR-gate element OR1 may include a first input terminal that is connected to the output terminal of the first AND-gate element AND1, a second input terminal that receives the input data D, and an output terminal that outputs an OR-operation result between the AND-operation result of the first AND-gate element AND1 and the input data D. The first NAND-gate element NAND1 may include a first input terminal that is connected to the output terminal of the first OR-gate element OR1, a second input terminal that is connected to the second node N2, and an output terminal (e.g., the first node N1) that outputs a NAND-operation result between the OR-operation result of the first OR-gate element OR1 and a voltage signal of the second node N2. The first inverter element INV1 may be connected between the second input terminal of the first OR-gate element OR1 and the first input terminal of the second OR-gate element OR2. The first inverter element INV1 may invert the input data D to output the inverted input data DN. The second AND-gate element AND2 may include a first input terminal that is connected to the first node N1, a second input terminal that receives the clock signal CK, a third input terminal that is connected to the sixth node N6, and an output terminal that outputs an AND-operation result among a voltage signal of the first node N1, the clock signal CK, and a voltage signal of the sixth node N6. The second OR-gate element OR2 may include a first input terminal that receives the inverted input data DN, a second input terminal that is connected to the output terminal of the second AND-gate element AND2, and an output terminal that outputs an OR-operation result between the inverted input data DN and the AND-operation result of the second AND-gate element AND2. The second NAND-gate element NAND2 may include a first input terminal that is connected to the first node N1, a second input terminal that is connected to the output terminal of the second OR-gate element OR2, and an output terminal (e.g., the second node N2) that outputs a NAND-operation result between a voltage signal of the first node N1 and the OR-operation result of the second OR-gate element OR2.

The third OR-gate element OR3 may include a first input terminal that receives the inverted input data DN, a second input terminal that is connected to the first node N1, and an output terminal that outputs an OR-operation result between the inverted input data DN and the voltage signal of the first node N1. The third AND-gate element AND3 may include a first input terminal that is connected to the output terminal of the third OR-gate element OR3, a second input terminal that receives the clock signal CK, a third input terminal that is connected to the first node N1, and an output terminal that outputs an AND-operation result among the OR-operation result of the third OR-gate element OR3, the clock signal CK, and the voltage signal of the first node N1. The first NOR-gate element NOR1 may include a first input terminal that is connected to the output terminal of the third AND-gate element AND3, a second input terminal that is connected to the sixth node N6, and an output terminal (e.g., the fifth node N5) that outputs a NOR-operation result between the AND-operation result of the third AND-gate element AND3 and the voltage signal of the sixth node N6. The fourth OR-gate element OR4 may include a first input terminal that is connected to the second node N2, a second input terminal that receives the input data D, and an output terminal that outputs an OR-operation result between the voltage signal of the second node N2 and the input data D. The fourth AND-gate element AND4 may include a first input terminal that is connected to the second node N2, a second input terminal that receives the clock signal CK, a third input terminal that is connected to the output terminal of the fourth OR-gate element OR4, and an output terminal that outputs an AND-operation result among the voltage signal of the second node N2, the clock signal CK, and the OR-operation result of the fourth OR-gate element OR4. The second NOR-gate element NOR2 may include a first input terminal that is connected to the fifth node N5, a second input terminal that is connected to the output terminal of the fourth AND-gate element AND4, and an output terminal (e.g., the sixth node N6) that outputs a NOR-operation result between the voltage signal of the fifth node N5 and the AND-operation result of the fourth AND-gate element AND4. The second inverter element INV2 may be connected between the sixth node N6 and the output node OUT. The second inverter element INV2 may invert the voltage signal of the sixth node N6 to output the output data Q.

Based on the above structure, the flip-flop 200 may latch the input data D at the rising edges of the clock signal CK and may output the latched input data D as the output data Q at the output node OUT. Specifically, as illustrated in FIG. 7A, when the clock signal CK has a logic 'low' level (e.g., indicated by 0), the AND-operation result of the first AND-gate element AND1 may have a logic 'low' level. Here, since the first OR-gate element OR1 performs an OR-operation between the AND-operation result of the first AND-gate element AND1 (e.g., a logic 'low' level) and the input data D, the OR-operation result of the first OR-gate element OR1 may be the input data D. The first inverter element INV1 may invert the input data D to output the inverted input data DN. When the clock signal CK has a logic 'low' level (e.g., indicated by 0), the AND-operation result of the second AND-gate element AND2 may have a logic 'low' level. Here, since the second OR-gate element OR2 performs an OR-operation between the AND-operation result of the second AND-gate element AND2 (e.g., a logic 'low' level) and the inverted input data DN, the OR-operation result of the second OR-gate element OR2 may be the inverted input data DN. As described above, the output terminal (e.g., the first node N1) of the first NAND-gate element NAND1 may be connected to the first input terminal of the second NAND-gate element NAND2, and the output terminal (e.g., the second node N2) of the second NAND-gate element NAND2 may be connected to the second input terminal of the first NAND-gate element NAND1. In other words, the first node N1 and the second node N2 may be cross-connected, and thus the first node N1 and the second node N2 may complementarily operate (e.g., node-values of the first node N1 and the second node N2 may be complementarily determined). Specifically, since the first NAND-gate element NAND1 performs a NAND-operation between the OR-operation result of the first OR-gate element OR1 (e.g., the input data D) and the voltage signal of the second node N2, the NAND-operation result of the first NAND-gate element NAND1 may be determined (e.g., fixed) to be the inverted input data DN. In addition, since the second NAND-gate element NAND2 performs a NAND-operation between the OR-operation result of the second OR-gate element OR2 (e.g., the inverted input data DN) and the voltage signal of the first node N1, the NAND-operation result of the second NAND-gate element NAND2 may be determined (e.g., fixed) to be the input data D. As a result, the voltage signal of the first node N1 may maintain a logic level corresponding to the inverted input data DN, and the voltage signal of the second node N2 may maintain a logic level corresponding to the input data D. Since the third OR-gate element OR3 receives the inverted input data DN at its first input terminal and receives the inverted input data DN at its second input terminal, the OR-operation result of the third OR-gate element OR3 may be the inverted input data DN. Since the fourth OR-gate element OR4 receives the input data D at its first input terminal and receives the input data D at its second input terminal, the OR-operation result of the fourth OR-gate element OR4 may be the input data D. However, since the clock signal CK has a logic 'low' level, the AND-operation result of the third AND-gate element AND3 and the AND-operation result of the fourth AND-gate element AND4 may have a logic 'low' level.

Subsequently, as illustrated in FIG. 7B, when the clock signal CK is changed from a logic 'low' level to a logic 'high' level (e.g., a rising edge of the clock signal CK), the third AND-gate element AND3 may receive the inverted input data DN at its first input terminal, may receive the clock signal CK having a logic 'high' level at its second input terminal, and may receive the inverted input data DN at its third input terminal. Thus, the AND-operation result of the third AND-gate element AND3 may be the inverted input data DN. In addition, the fourth AND-gate element AND4 may receive the input data D at its first input terminal, may receive the clock signal CK having a logic 'high' level at its second input terminal, and may receive the input data D at its third input terminal. Thus, the AND-operation result of the fourth AND-gate element AND4 may be the input data D. As described above, the output terminal of the first NOR-gate element NOR1 (e.g., the fifth node N5) may be connected to the first input terminal of the second NOR-gate element NOR2, and the output terminal of the second NOR-gate element NOR2 (e.g., the sixth node N6) may be connected to the second input terminal of the first NOR-gate element NOR1. In other words, the fifth node N5 and the sixth node N6 may be cross-connected, and thus the fifth node N5 and the sixth node N6 may complementarily operate (e.g., node-values of the fifth node N5 and the sixth node N6 may be complementarily determined). Specifically, since the first NOR-gate element NOR1 performs a NOR-operation between the AND-operation result of the third AND-gate element AND3 (e.g., the inverted input data DN) and the voltage signal of the sixth node N6, the NOR-operation result of the first NOR-gate element NOR1 may be determined (or, fixed) to be the input data D. In addition, since the second NOR-gate element NOR2 performs a NOR-operation between the AND-operation result of the fourth AND-gate element AND4 (e.g., the input data D) and the voltage signal of the fifth node N5, the NOR-operation result of the second NOR-gate element NOR2 may be determined (or, fixed) to be the inverted input data DN. As a result, the voltage signal of the fifth node N5 may maintain a logic level corresponding to the input data D, and the voltage signal of the sixth node N6 may maintain a logic level corresponding to the inverted input data DN. In other words, the input data D and the inverted input data DN may be latched at the fifth node N5 and the sixth node N6, respectively. Thus, the second inverter element INV2 may invert the voltage signal of the sixth node N6 (e.g., the inverted input data DN) to output the input data D as the output data Q. That is, since the voltage signal of the output node OUT is the voltage signal generated by inverting the voltage signal of the sixth node N6, the voltage signal of the output node OUT may have a logic level corresponding to the input data D. In brief, the flip-flop 200 may latch the input data D at the rising edges of the clock signal CK and may output the latched input data D as the output data Q at the output node OUT.

Figure 8:
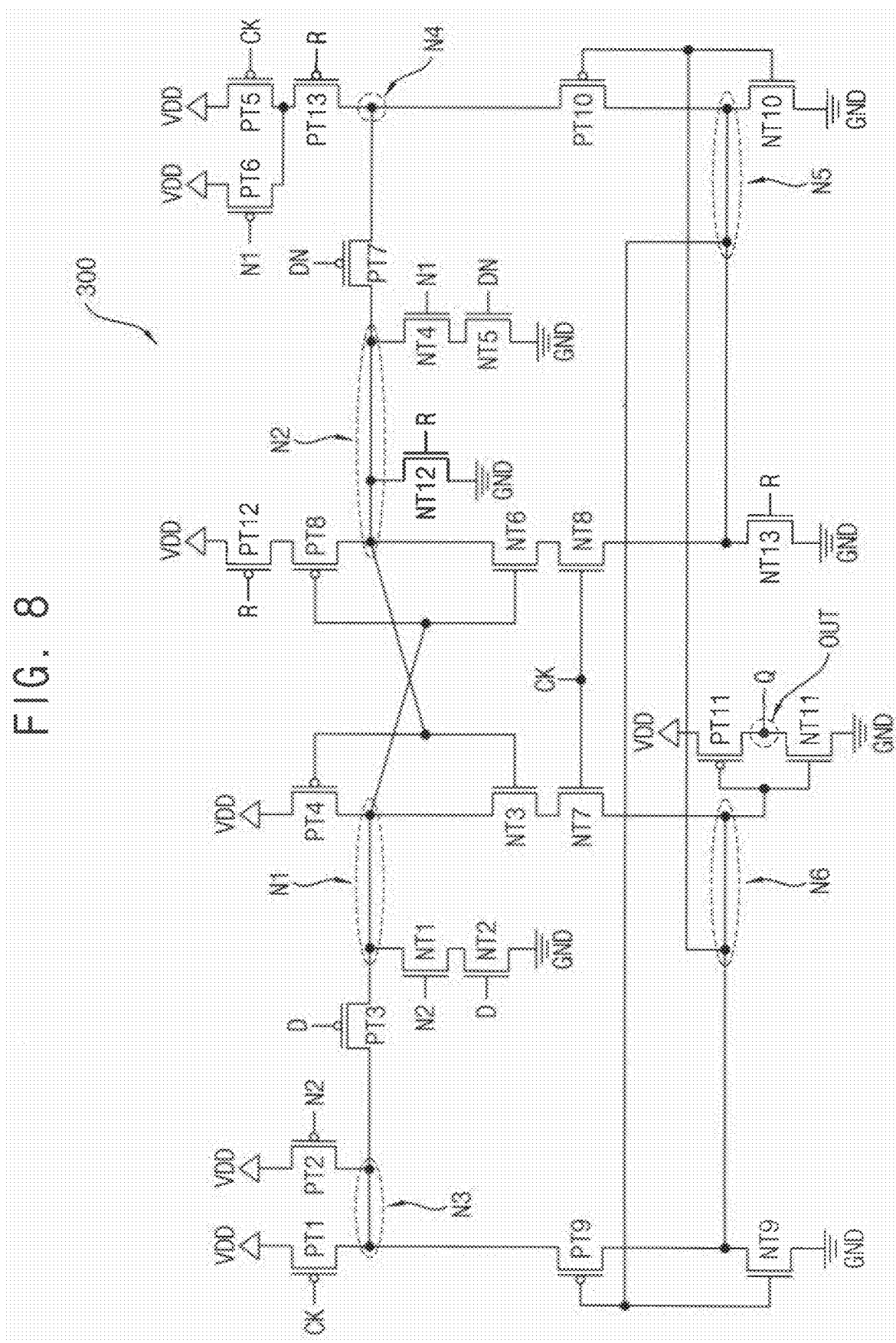
FIG. 8 is a circuit diagram illustrating a flip-flop according to some example embodiments.
Figure 9A:
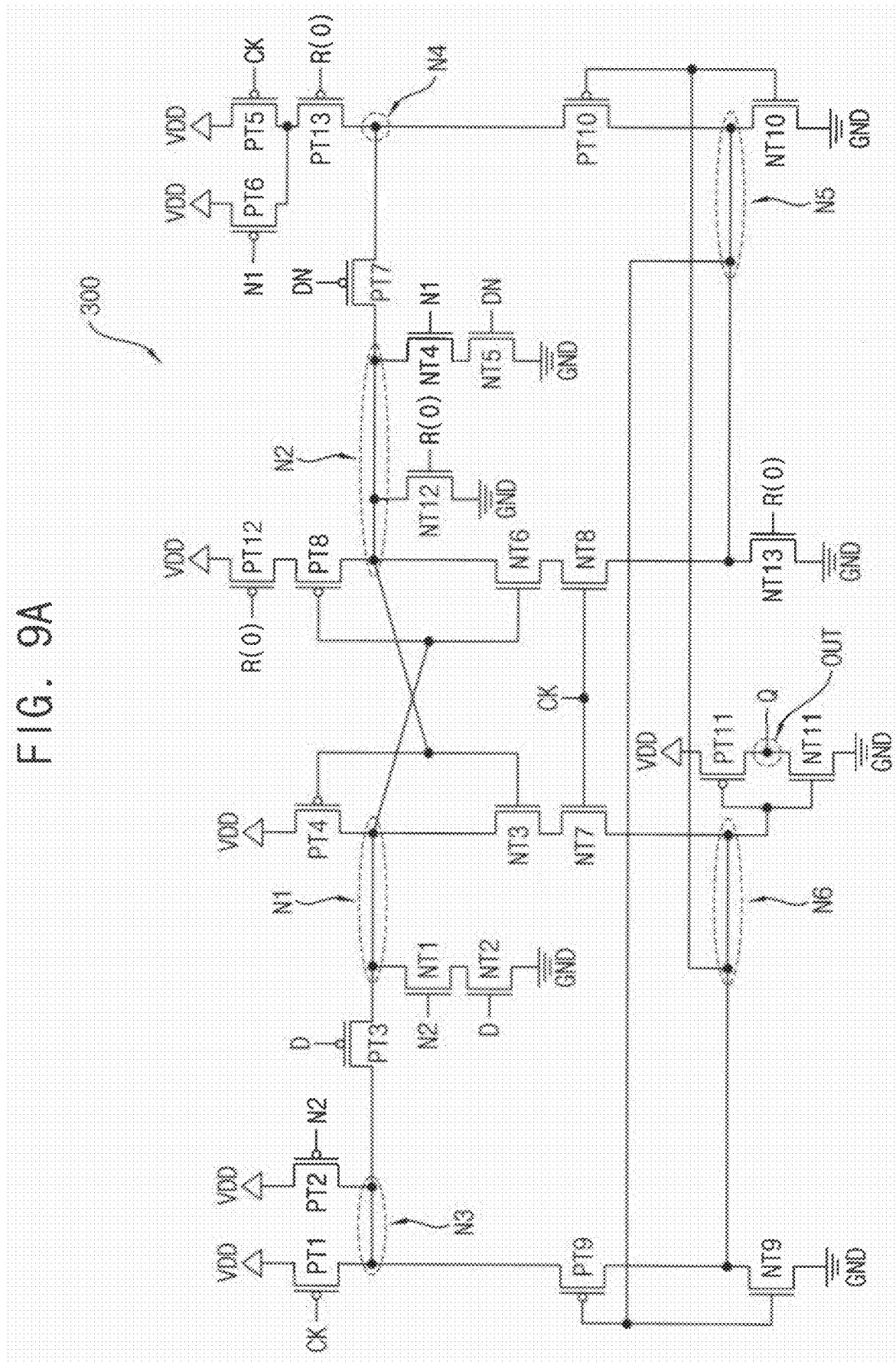
FIGS. 9A and 9B are diagrams for describing an operation of the flip-flop of FIG. 8.
Figure 9B:
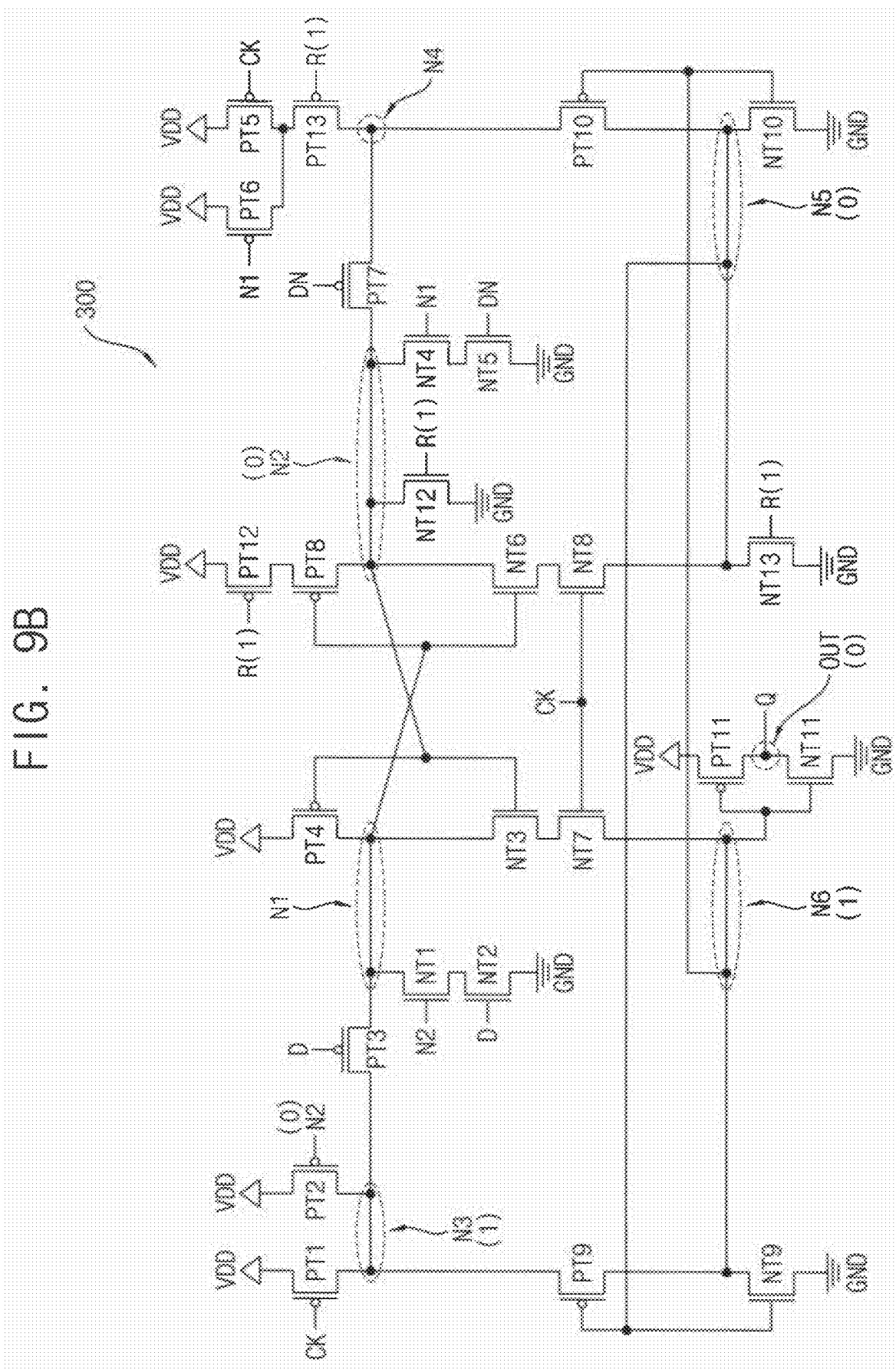

FIG. 8 is a circuit diagram illustrating a flip-flop according to some example embodiments. FIGS. 9A and 9B are diagrams for describing an operation of the flip-flop of FIG. 8.

Referring to FIGS. 8 through 9B, the flip-flop 300 may include first through thirteenth PMOS transistors PT1 through PT13 and first through thirteenth NMOS transistors NT1 through NT13. That is, the flip-flop 300 may have a structure in which the twelfth and thirteenth PMOS transistors PT12 and PT13 and the twelfth and thirteenth NMOS transistors NT12 and NT13 are added to the flip-flop 200 of FIG. 4 to include the reset function. Thus, the description duplicated with the flip-flop 200 of FIG. 4 will not be repeated. Hereinafter, the description will focus on the twelfth and thirteenth PMOS transistors PT12 and PT13 and the twelfth and thirteenth NMOS transistors NT12 and NT13.

The flip-flop 300 may latch the input data D at the rising edges of the clock signal CK and may output the latched input data D as the output data Q at the output node OUT. In addition, the flip-flop 300 may receive a reset signal R and may reset the output data Q to have a logic 'low' level when the reset signal R has a logic 'high' level. For this operation, the flip-flop 300 may have a structure in which the twelfth and thirteenth PMOS transistors PT12 and PT13 and the twelfth and thirteenth NMOS transistors NT12 and NT13 are added to the flip-flop 200 of FIG. 4. The twelfth PMOS transistor PT12 may be connected between the high power voltage VDD and the eighth PMOS transistor PT8. That is, the twelfth PMOS transistor PT12 may include a first terminal that is connected to the high power voltage VDD, a second terminal that is connected to a first terminal of the eighth PMOS transistor PT8, and a gate terminal that receives the reset signal R. Thus, when the twelfth PMOS transistor PT12 turns on in response to the reset signal R, the high power voltage VDD may be applied to the first terminal of the eighth PMOS transistor PT8. The thirteenth PMOS transistor PT13 may be connected between the fourth node N4 and the fifth and sixth PMOS transistors PT5 and PT6. That is, the thirteenth PMOS transistor PT13 may include a first terminal that is connected to second terminals of the fifth and sixth PMOS transistors PT5 and PT6, a second terminal that is connected to the fourth node N4, and a gate terminal that receives the reset signal R. Thus, when the thirteenth PMOS transistor PT13 turns on in response to the reset signal R, the second terminals of the fifth and sixth PMOS transistors PT5 and PT6 may be connected to the fourth node N4. The twelfth NMOS transistor NT12 may be connected between the second node N2 and the low power voltage GND. That is, the twelfth NMOS transistor NT12 may include a first terminal that is connected to the second node N2, a second terminal that is connected to the low power voltage GND, and a gate terminal that receives the reset signal R. Thus, when the twelfth NMOS transistor NT12 turns on in response to the reset signal R, the low power voltage GND may be applied to the second node N2. The thirteenth NMOS transistor NT13 may be connected between the fifth node N5 and the low power voltage GND. That is, the thirteenth NMOS transistor NT13 may include a first terminal that is connected to the fifth node N5, a second terminal that is connected to the low power voltage GND, and a gate terminal that receives the reset signal R. Thus, when the thirteenth NMOS transistor NT13 turns on in response to the reset signal R, the low power voltage GND may be applied to the fifth node N5.

Based on the above structure, the flip-flop 300 may output the output data Q having a logic 'low' level when the reset signal R has a logic 'high' level. Specifically, as illustrated in FIG. 9A, when the reset signal R has a logic 'low' level, the twelfth PMOS transistor PT12 may turn on, the thirteenth PMOS transistor PT13 may turn on, the twelfth NMOS transistor NT12 may turn off, and the thirteenth NMOS transistor NT13 may turn off. Thus, when the reset signal R has a logic 'low' level, the flip-flop 300 may have the same structure as the flip-flop 200 of FIG. 4. As a result, the flip-flop 300 may latch the input data D at the rising edges of the clock signal CK and may output the latched input data D as the output data Q at the output node OUT. On the other hand, as illustrated in FIG. 9B, when the reset signal R has a logic 'high' level, the twelfth PMOS transistor PT12 may turn off, the thirteenth PMOS transistor PT13 may turn off, the twelfth NMOS transistor NT12 may turn on, and the thirteenth NMOS transistor NT13 may turn on. Therefore, the voltage signal of the second node N2 and the voltage signal of the fifth node N5 may have a logic 'low' level. Here, since the voltage signal of the second node N2 has a logic 'low' level, the second PMOS transistor PT2 may turn on. As a result, the voltage signal of the first node N1 may have a logic 'high' level. In addition, since the voltage signal of the fifth node N5 has a logic 'low' level, the ninth PMOS transistor PT9 may turn on. As a result, the voltage signal of the sixth node N6 may also have a logic 'high' level. Here, the eleventh PMOS transistor PT11 and the eleventh NMOS transistor NT11 may operate as an inverter circuit. Thus, the voltage signal of the output node OUT may be a voltage signal generated by inverting the voltage signal of the sixth node N6, and thus the voltage signal of the output node OUT may have a logic 'low' level. In summary, the flip-flop 300 may reset the output data Q to have a logic 'low' level when the reset signal R has a logic 'high' level.

Figure 10:
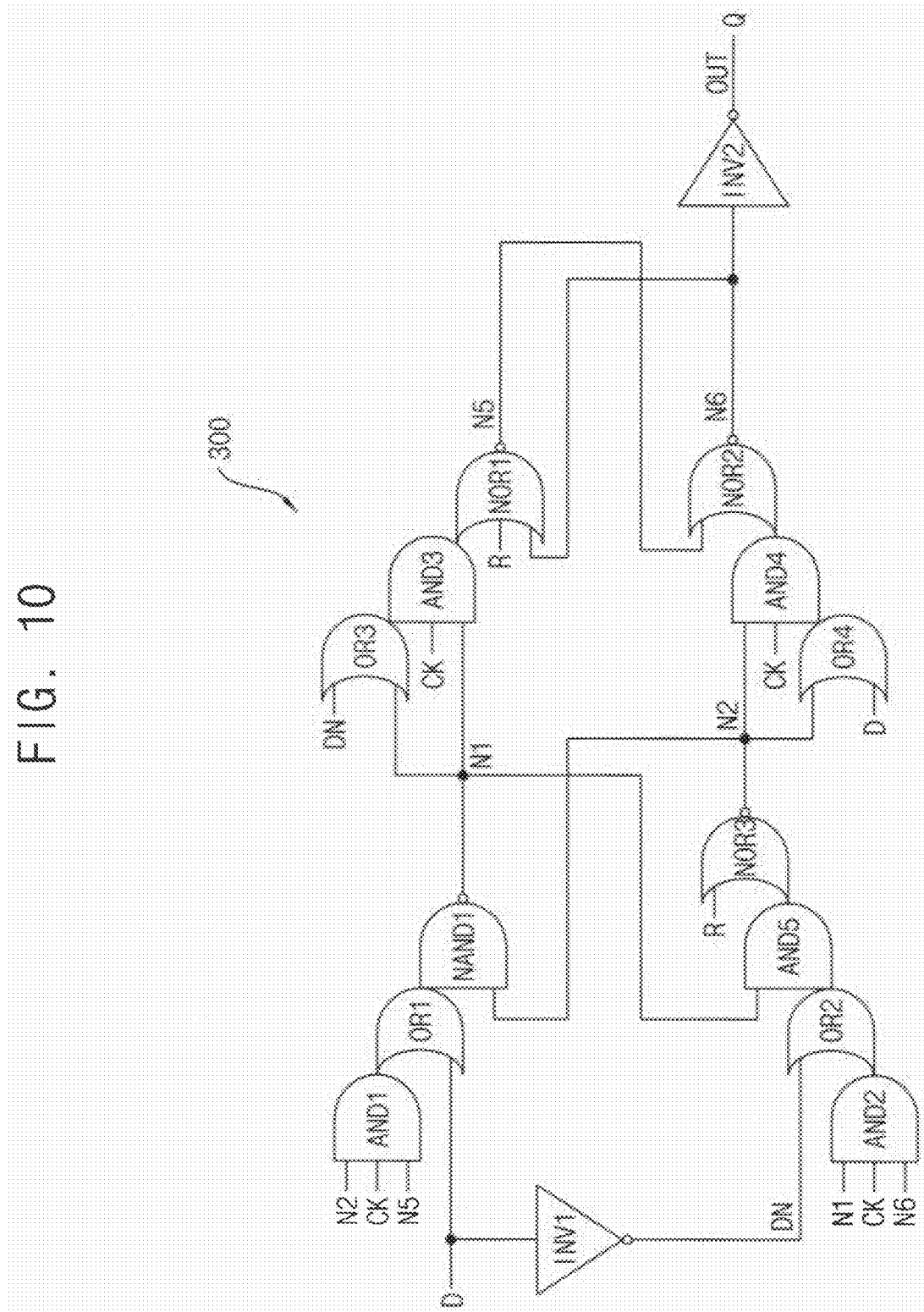
FIG. 10 is a block diagram illustrating an example in which the flip-flop of FIG. 8 is implemented by logic elements.
Figure 11A:
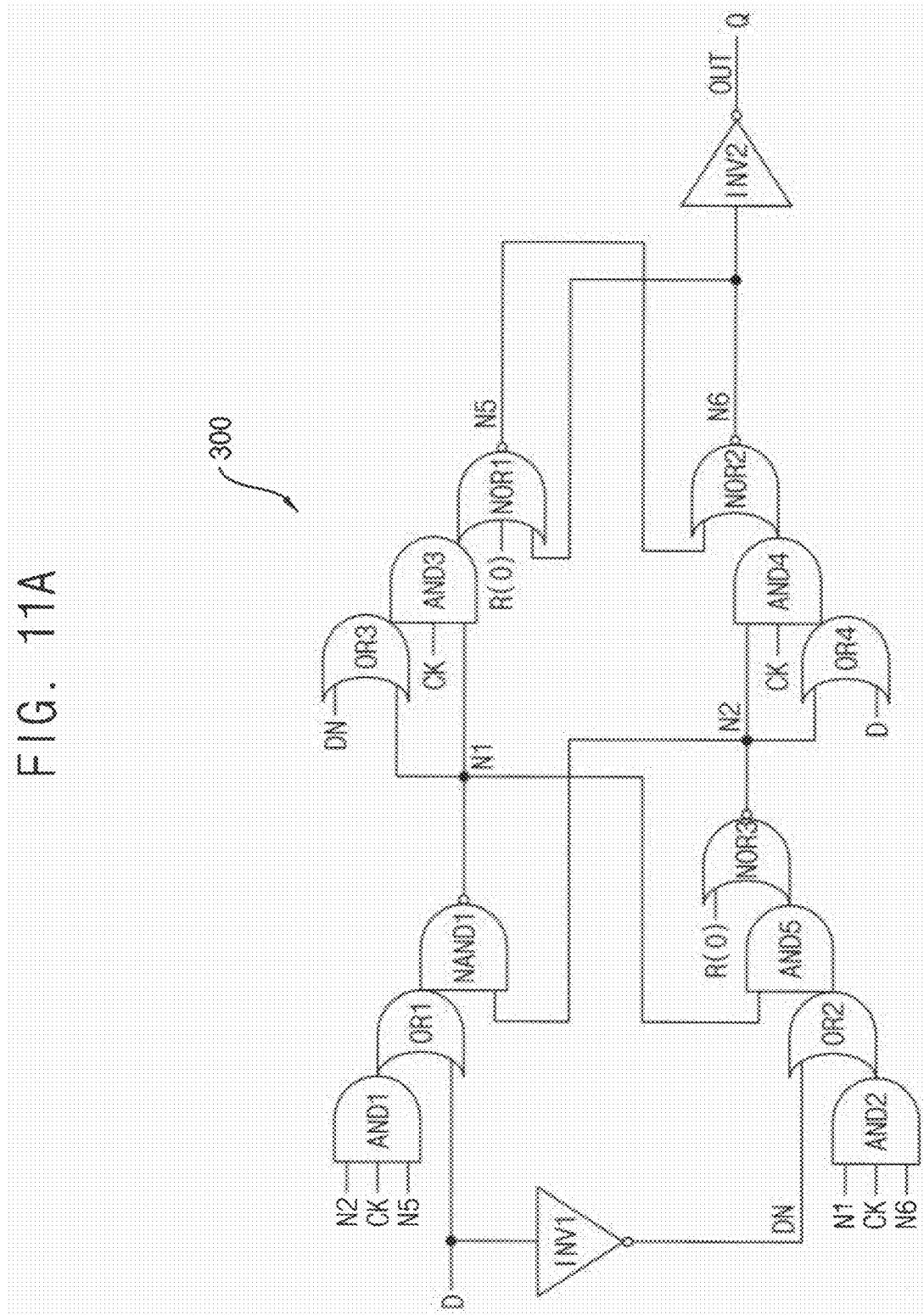
FIGS. 11A and 11B are diagrams for describing an operation of the flip-flop of FIG. 10.
Figure 11B:
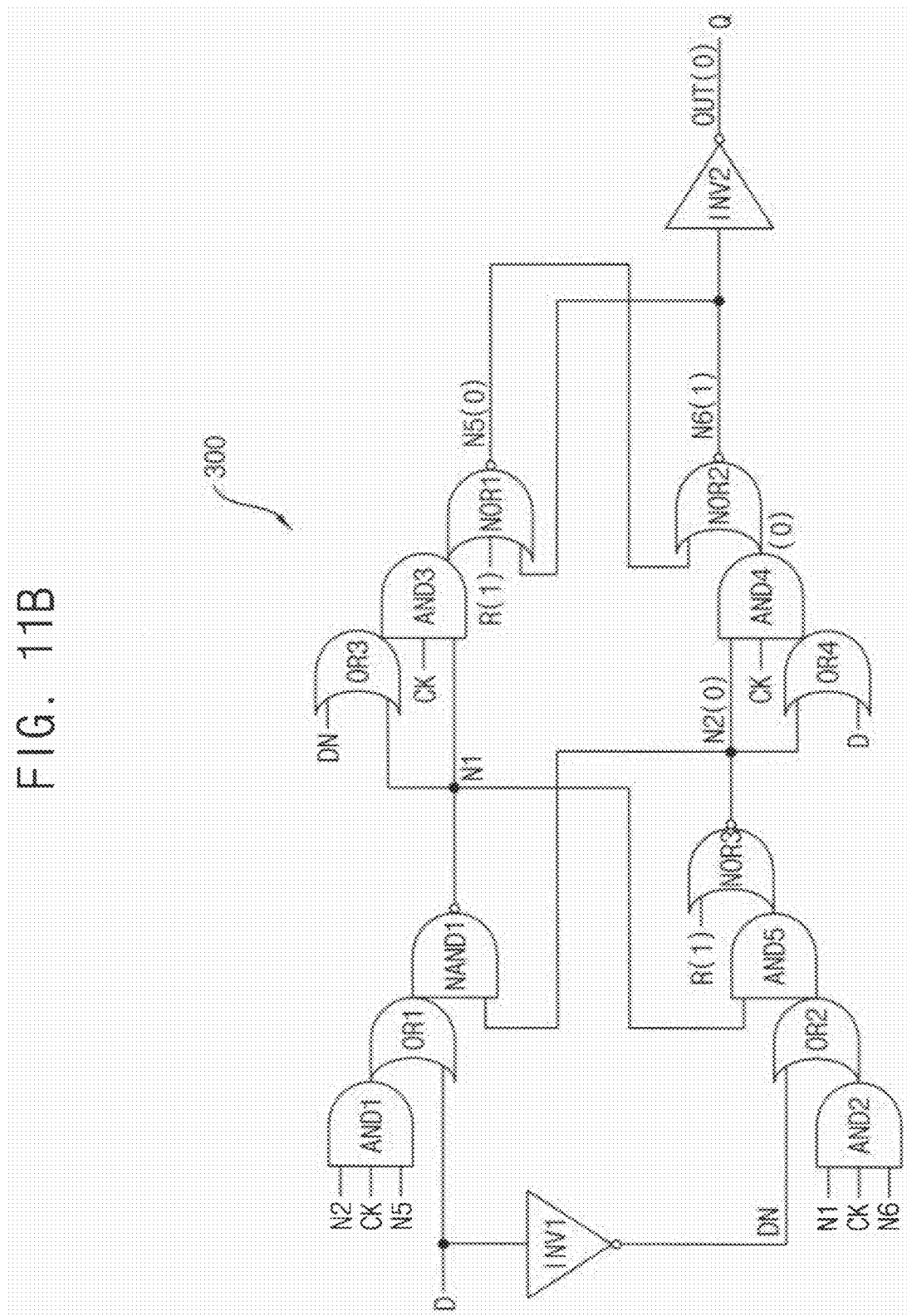

FIG. 10 is a block diagram illustrating an example in which the flip-flop of FIG. 8 is implemented by logic elements. FIGS. 11A and 11B are diagrams for describing an operation of the flip-flop of FIG. 10.

Referring to FIGS. 10 through 11B, the flip-flop 300 may include a first AND-gate element AND1, a first OR-gate element OR1, a first NAND-gate element NAND1, a first inverter element INV1, a second AND-gate element AND2, a second OR-gate element OR2, a fifth AND-gate element AND5, a third NOR-gate element NOR3, a third OR-gate element OR3, a third AND-gate element AND3, a first NOR-gate element NOR1, a fourth OR-gate element OR4, a fourth AND-gate element AND4, a second NOR-gate element NOR2, and a second inverter element INV2. That is, the flip-flop 300 may have a structure in which the second NAND-gate element NAND2 of the flip-flop 200 of FIG. 6 is replaced with the fifth AND-gate element AND5 and the third NOR-gate element NOR3 and the reset signal R is additionally input to the first NOR-gate element NOR1 of the flip-flop 200 of FIG. 6 to include the reset function. Thus, the description duplicated with the flip-flop 200 of FIG. 6 will not be repeated. Hereinafter, the description will focus on the fifth AND-gate element AND5, the third NOR-gate element NOR3, and the first NOR-gate element NOR1.

The flip-flop 300 may latch the input data D at the rising edges of the clock signal CK and may output the latched input data D as the output data Q at the output node OUT. In addition, the flip-flop 300 may receive the reset signal R and may reset the output data Q to have a logic 'low' level when the reset signal R has a logic 'high' level. For this operation, the flip-flop 300 may have a structure in which the second NAND-gate element NAND2 of the flip-flop 200 of FIG. 6 is replaced with the fifth AND-gate element AND5 and the third NOR-gate element NOR3 and the reset signal R is additionally input to the first NOR-gate element NOR1 of the flip-flop 200 of FIG. 6. The fifth AND-gate element AND5 may include a first input terminal that is connected to the first node N1, a second input terminal that is connected to the output terminal of the second OR-gate element OR2, and an output terminal that outputs an AND-operation result between the voltage signal of the first node N1 and the OR-operation result of the second OR-gate element OR2. The third NOR-gate element NOR3 may include a first input terminal that receives the reset signal R, a second input terminal that is connected to the output terminal of the fifth AND-gate element AND5, and an output terminal (e.g., the second node N2) that outputs a NOR-operation result between the reset signal R and the AND-operation result of the fifth AND-gate element AND5. The first NOR-gate element NOR1 may include a first input terminal that is connected to the output terminal of the third AND-gate element AND3, a second input terminal that receives the reset signal R, a third input terminal that is connected to the sixth node N6, and an output terminal (e.g., the fifth node N5) that outputs a NOR-operation result among the AND-operation result of the third AND-gate element AND3, the reset signal R, and the voltage signal of the sixth node N6.

Based on the above structure, the flip-flop 300 may output the output data Q having a logic 'low' level when the reset signal R has a logic 'high' level. Specifically, as illustrated in FIG. 11A, when the reset signal R has a logic 'low' level, the fifth AND-gate element AND5 and the third NOR-gate element NOR3 of the flip-flop 300 may operate as the second NAND-gate element NAND2 of the flip-flop 200 of FIG. 6 because the third NOR-gate element NOR3 operates as an inverter element. In addition, when the reset signal R has a logic 'low' level, the reset signal R input to the second input terminal of the first NOR-gate element NOR1 may not affect the NOR-operation result of the first NOR-gate element NOR1. Thus, the first NOR-gate element NOR1 of the flip-flop 300 may operate as the first NOR-gate element NOR1 of the flip-flop 200 of FIG. 6. As a result, the flip-flop 300 may latch the input data D at the rising edges of the clock signal CK and may output the latched input data D as the output data Q at the output node OUT. On the other hand, as illustrated in FIG. 11B, when the reset signal R has a logic 'high' level, the NOR-operation result of the third NOR-gate element NOR3 may have a logic 'low' level (e.g., the voltage signal of the second node N2 may have a logic 'low' level). Thus, the AND-operation result of the fourth AND-gate element AND4 may have a logic 'low' level. In addition, when the reset signal R has a logic 'high' level, the NOR-operation result of the first NOR-gate element NOR1 may have a logic 'low' level (e.g., the voltage signal of the fifth node N5 may have a logic 'low' level). Thus, the second NOR-gate element NOR2 may receive the voltage signal having a logic 'low' level at the first input terminal and may receive the voltage signal having a logic 'low' level at the second input terminal. As a result, the NOR-operation result of the second NOR-gate element NOR2 may have a logic 'high' level (e.g., the voltage signal of the sixth node N6 may have a logic 'high' level). Here, since the second inverter element INV2 inverts the voltage signal of the sixth node N6 to output the output data Q, the voltage signal of the output node OUT may be a voltage signal generated by inverting the voltage signal of the sixth node N6. Thus, the voltage signal of the output node OUT may have a logic 'low' level. In summary, the flip-flop 300 may reset the output data Q to have a logic 'low' level when the reset signal R has a logic 'high' level.

Figure 12:
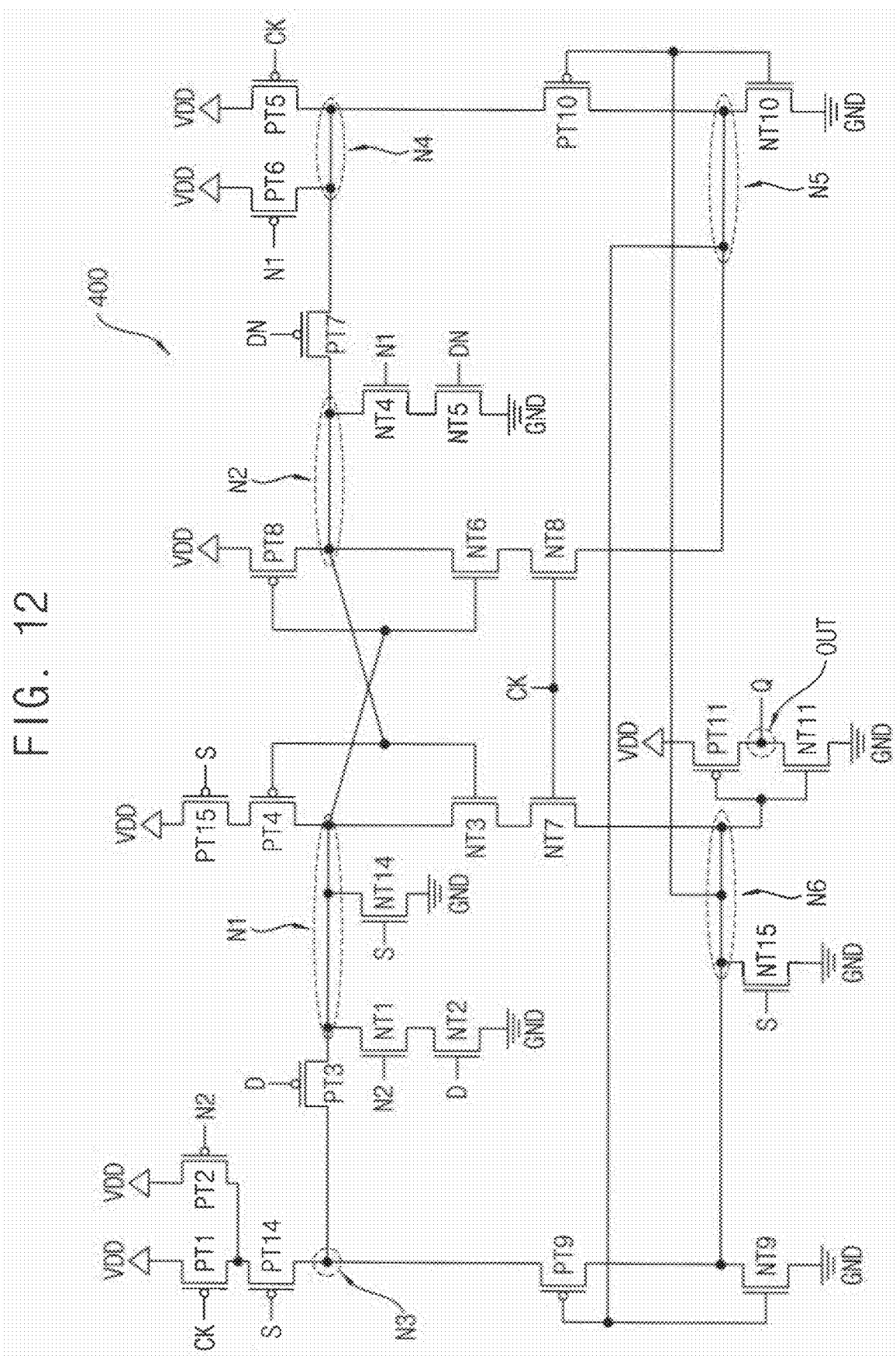
FIG. 12 is a circuit diagram illustrating a flip-flop according to some example embodiments.
Figure 13A:
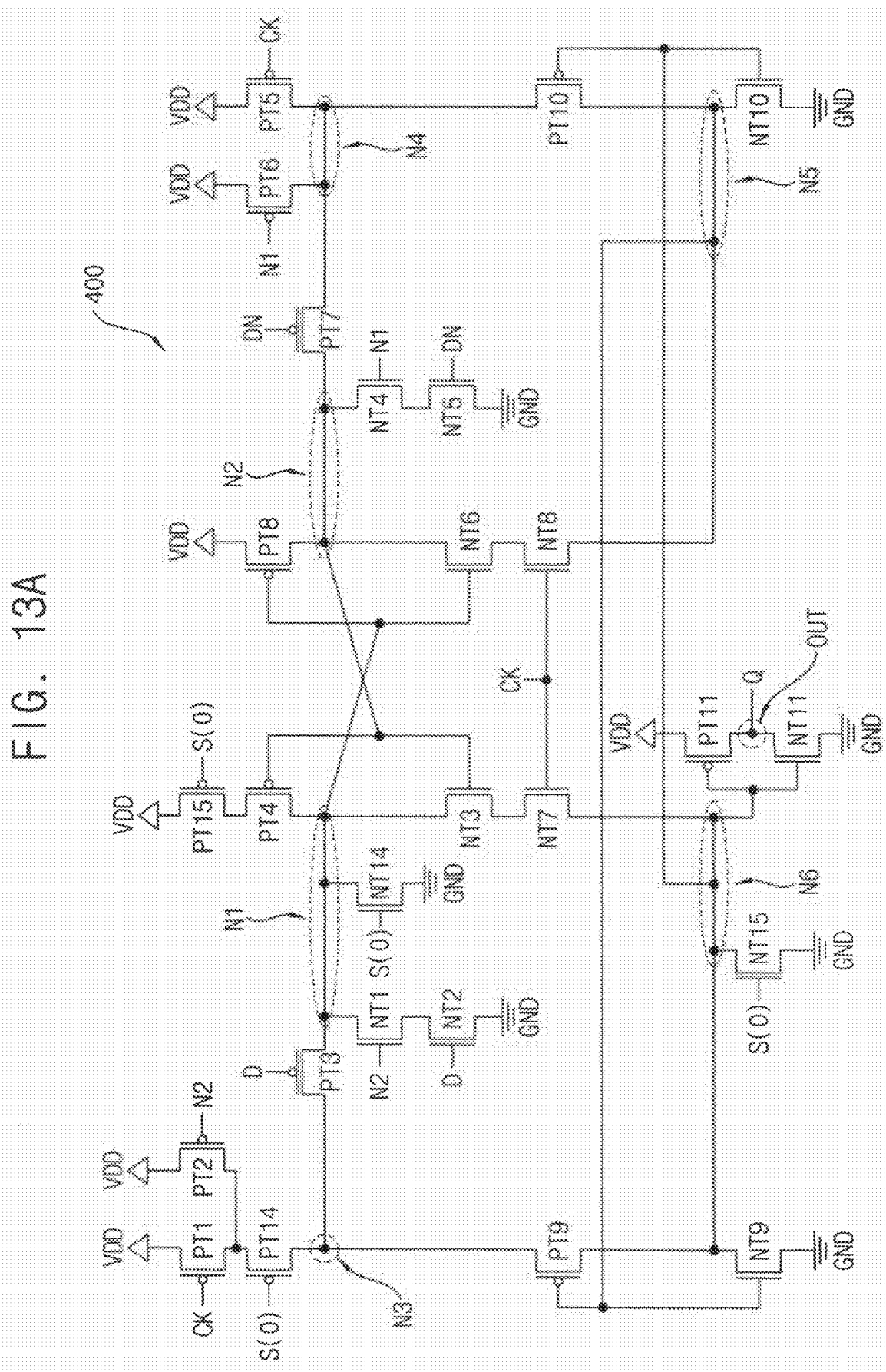
FIGS. 13A and 13B are diagrams for describing an operation of the flip-flop of FIG. 12.
Figure 13B:
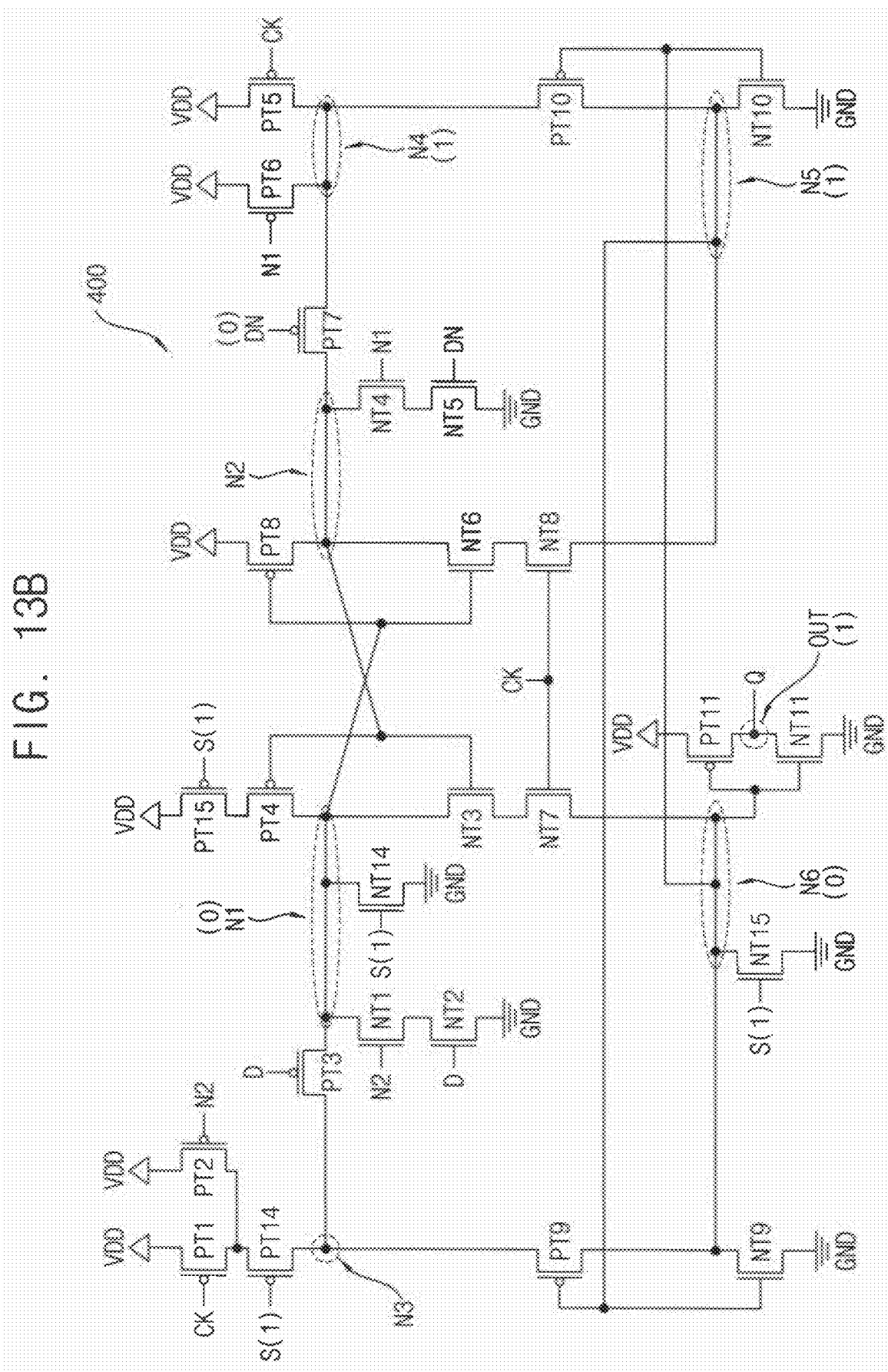

FIG. 12 is a circuit diagram illustrating a flip-flop according to some example embodiments. FIGS. 13A and 13B are diagrams for describing an operation of the flip-flop of FIG. 12.

Referring to FIGS. 12 through 13B, the flip-flop 400 may include first through eleventh PMOS transistors PT1 through PT11, fourteenth and fifteenth PMOS transistors PT14 and PT15, first through eleventh NMOS transistors NT1 through NT11, and fourteenth and fifteenth NMOS transistors NT14 and NT15. That is, the flip-flop 400 may have a structure in which the fourteenth and fifteenth PMOS transistors PT14 and PT15 and the fourteenth and fifteenth NMOS transistors NT14 and NT15 are added to the flip-flop 200 of FIG. 4 to include the set function. Thus, the description duplicated with the flip-flop 200 of FIG. 4 will not be repeated. Hereinafter, the description will focus on the fourteenth and fifteenth PMOS transistors PT14 and PT15 and the fourteenth and fifteenth NMOS transistors NT14 and NT15.

The flip-flop 400 may latch the input data D at the rising edges of the clock signal CK and may output the latched input data D as the output data Q at the output node OUT. In addition, the flip-flop 400 may receive a set signal S and may set the output data Q to have a logic 'high' level when the set signal S has a logic 'high' level. For this operation, the flip-flop 400 may have a structure in which the fourteenth and fifteenth PMOS transistors PT14 and PT15 and the fourteenth and fifteenth NMOS transistors NT14 and NT15 are added to the flip-flop 200 of FIG. 4. The fourteenth PMOS transistor PT14 may be connected between the third node N3 and the second terminals of the first and second PMOS transistors PT1 and PT2. That is, the fourteenth PMOS transistor PT14 may include a first terminal that is connected to the second terminals of the first and second PMOS transistors PT1 and PT2, a second terminal that is connected to the third node N3, and a gate terminal that receives the set signal S. Thus, when the fourteenth PMOS transistor PT14 turns on in response to the set signal S, the second terminals of the first and second PMOS transistors PT1 and PT2 may be connected to the third node N3. The fifteenth PMOS transistor PT15 may be connected between the high power voltage VDD and the fourth PMOS transistor PT4. That is, the fifteenth PMOS transistor PT15 may include a first terminal that is connected to the high power voltage VDD, a second terminal that is connected to the first terminal of the fourth PMOS transistor PT4, and a gate terminal that receives the set signal S. Thus, when the fifteenth PMOS transistor PT15 turns on in response to the set signal S, the high power voltage VDD may be applied to the first terminal of the fourth PMOS transistor PT4. The fourteenth NMOS transistor NT14 may be connected between the first node N1 and the low power voltage GND. That is, the fourteenth NMOS transistor NT14 may include a first terminal that is connected to the first node N1, a second terminal that is connected to the low power voltage GND, and a gate terminal that receives the set signal S. Thus, when the fourteenth NMOS transistor NT14 turns on in response to the set signal S, the low power voltage GND may be applied to the first node N1. The fifteenth NMOS transistor NT15 may be connected between the sixth node N6 and the low power voltage GND. That is, the fifteenth NMOS transistor NT15 may include a first terminal that is connected to the sixth node N6, a second terminal that is connected to the low power voltage GND, and a gate terminal that receives the set signal S. Thus, when the fifteenth NMOS transistor NT15 turns on in response to the set signal S, the low power voltage GND may be applied to the sixth node N6.

Based on the above structure, the flip-flop 400 may output the output data Q having a logic 'high' level when the set signal S has a logic 'high' level. Specifically, as illustrated in FIG. 13A, when the set signal S has a logic 'low' level, the fourteenth PMOS transistor PT14 may turn on, the fifteenth PMOS transistor PT15 may turn on, the fourteenth NMOS transistor NT14 may turn off, and the fifteenth NMOS transistor NT15 may turn off. Thus, when the set signal S has a logic 'low' level, the flip-flop 400 may have the same structure as the flip-flop 200 of FIG. 4. As a result, the flip-flop 400 may latch the input data D at the rising edges of the clock signal CK and may output the latched input data D as the output data Q at the output node OUT. On the other hand, as illustrated in FIG. 13B, when the set signal S has a logic 'high' level, the fourteenth PMOS transistor PT14 may turn off, the fifteenth PMOS transistor PT15 may turn off, the fourteenth NMOS transistor NT14 may turn on, and the fifteenth NMOS transistor NT15 may turn on. Therefore, the voltage signal of the first node N1 and the voltage signal of the sixth node N6 may have a logic 'low' level. Here, since the voltage signal of the first node N1 has a logic 'low' level, the sixth PMOS transistor PT6 may turn on. As a result, the voltage signal of the fourth node N4 may have a logic 'high' level. In addition, since the voltage signal of the sixth node N6 has a logic 'low' level, the tenth PMOS transistor PT10 may turn on. As a result, the voltage signal of the fifth node N5 may also have a logic 'high' level. Further, since the ninth NMOS transistor NT9 turns on as the voltage signal of the fifth node N5 has a logic 'high' level, the voltage signal of the sixth node N6 may be determined (or, fixed) to have a logic 'low' level. Here, the eleventh PMOS transistor PT11 and the eleventh NMOS transistor NT11 may operate as an inverter circuit. Thus, the voltage signal of the output node OUT may be a voltage signal generated by inverting the voltage signal of the sixth node N6, and thus the voltage signal of the output node OUT may have a logic 'high' level. In summary, the flip-flop 400 may set the output data Q to have a logic 'high' level when the set signal S has a logic 'high' level.

Figure 14:
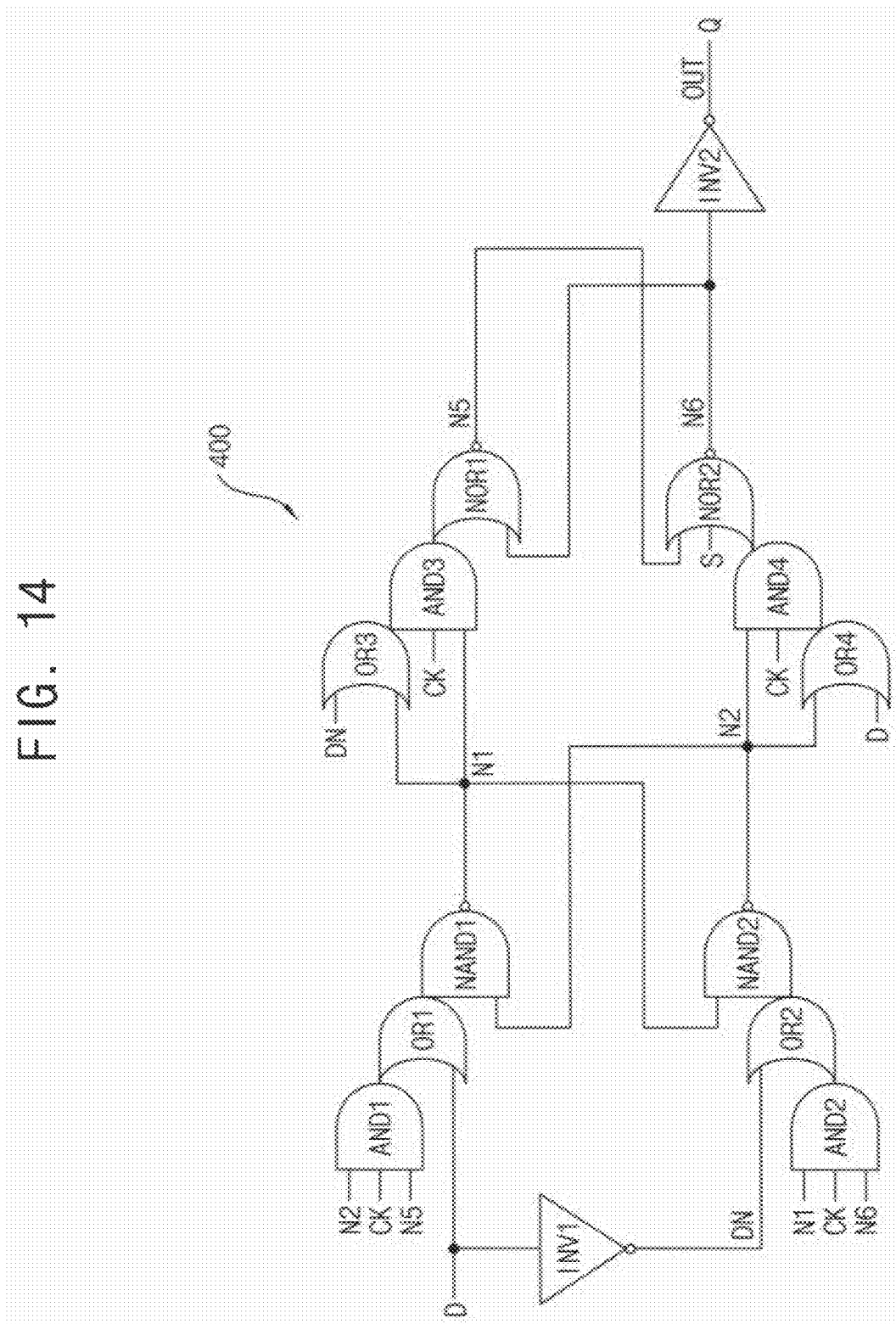
FIG. 14 is a block diagram illustrating an example in which the flip-flop of FIG. 12 is implemented by logic elements.
Figure 15A:
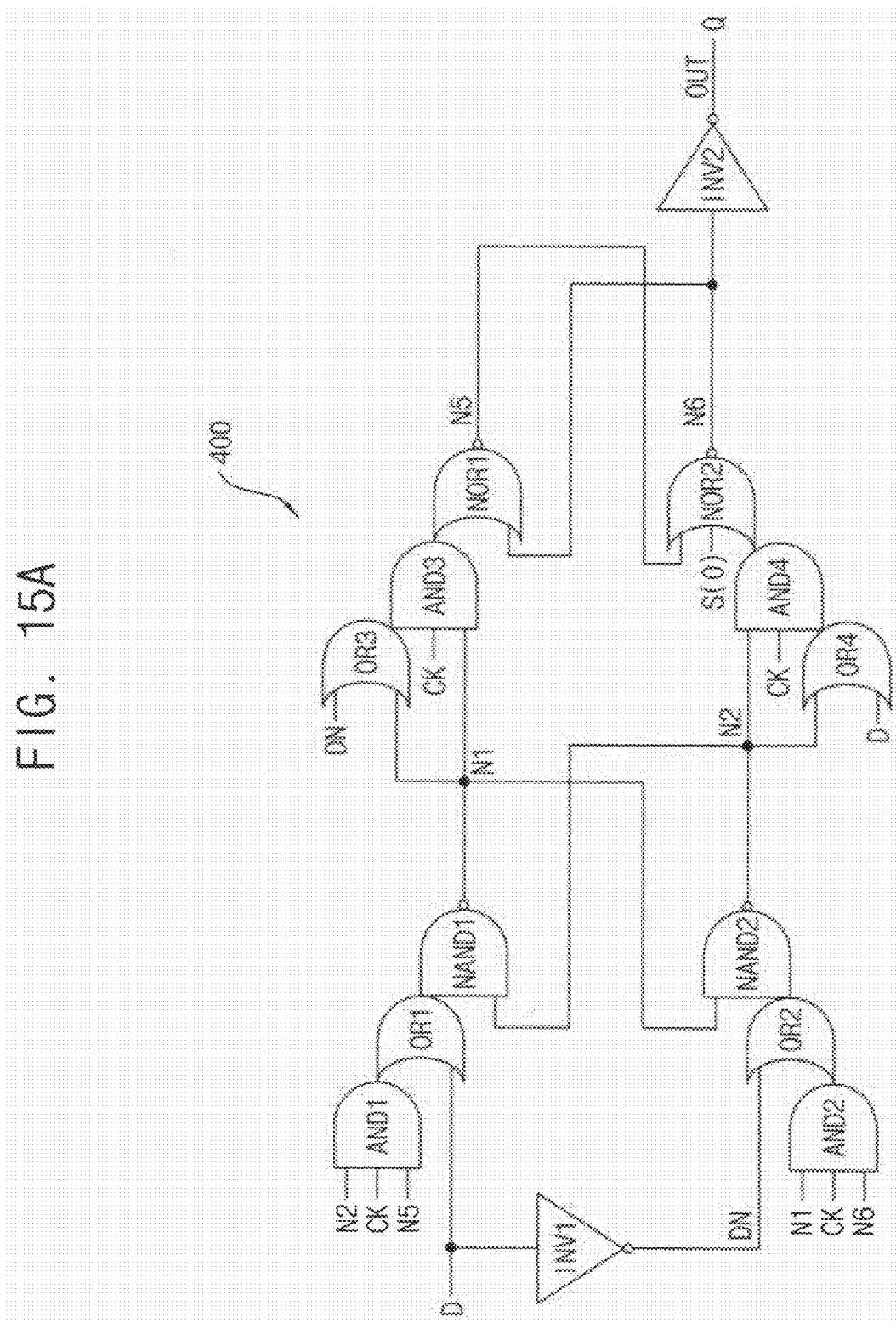
FIGS. 15A and 15B are diagrams for describing an operation of the flip-flop of FIG. 14.
Figure 15B:
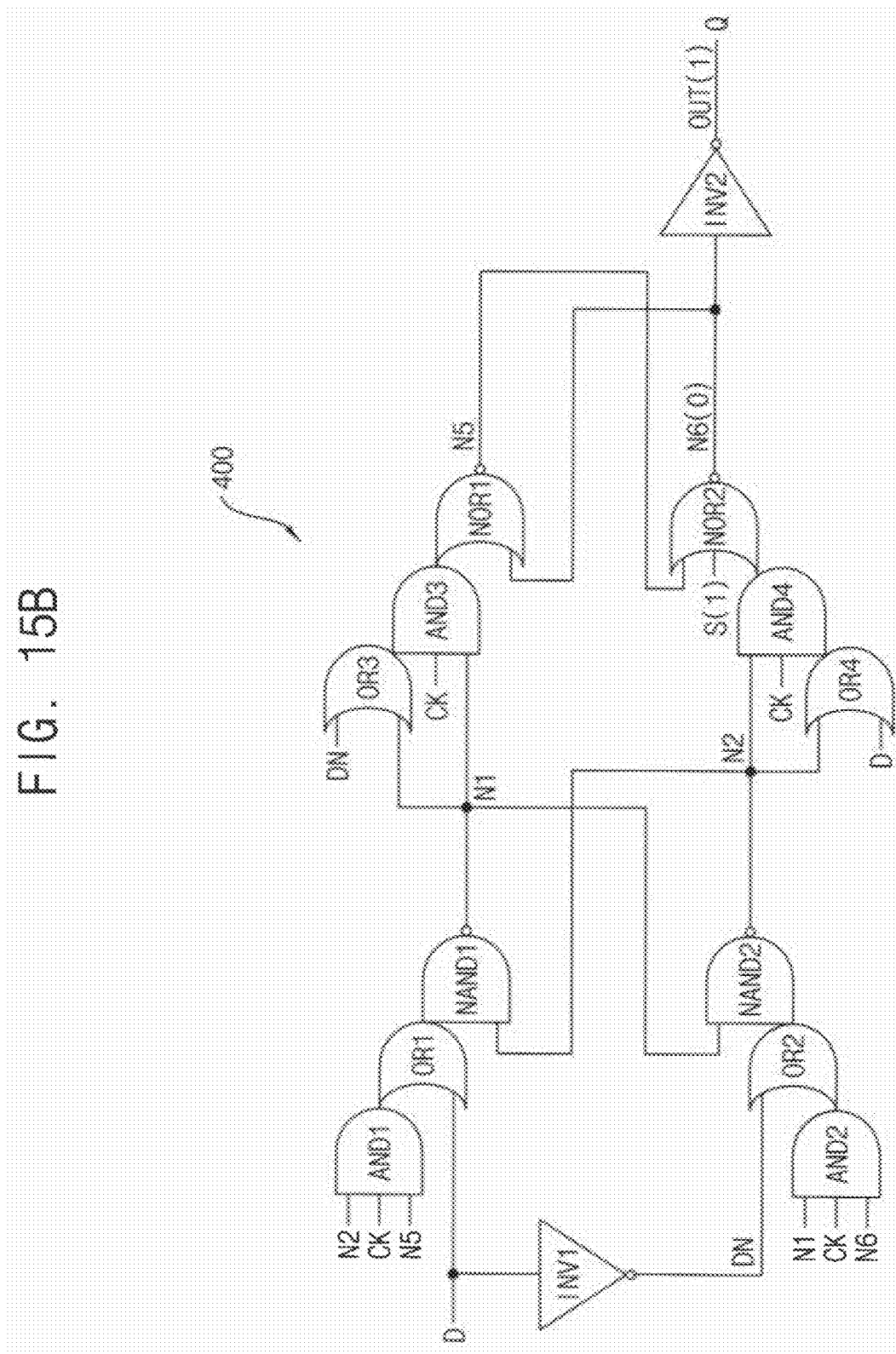

FIG. 14 is a block diagram illustrating an example in which the flip-flop of FIG. 12 is implemented by logic elements. FIGS. 15A and 15B are diagrams for describing an operation of the flip-flop of FIG. 14.

Referring to FIGS. 14 through 15B, the flip-flop 400 may include a first AND-gate element AND1, a first OR-gate element OR1, a first NAND-gate element NAND1, a first inverter element INV1, a second AND-gate element AND2, a second OR-gate element OR2, a second NAND-gate element NAND2, a third OR-gate element OR3, a third AND-gate element AND3, a first NOR-gate element NOR1, a fourth OR-gate element OR4, a fourth AND-gate element AND4, a second NOR-gate element NOR2, and a second inverter element INV2. That is, the flip-flop 400 may have a structure in which the set signal S is additionally input to the second NOR-gate element NOR2 of the flip-flop 200 of FIG. 6 to include the set function. Thus, the description duplicated with the flip-flop 200 of FIG. 6 will not be repeated. Hereinafter, the description will focus on the second NOR-gate element NOR2.

The flip-flop 400 may latch the input data D at the rising edges of the clock signal CK and may output the latched input data D as the output data Q at the output node OUT. In addition, the flip-flop 400 may receive the set signal S and may set the output data Q to have a logic 'high' level when the set signal S has a logic 'high' level. For this operation, the flip-flop 400 may have a structure in which the set signal S is additionally input to the second NOR-gate element NOR2 of the flip-flop 200 of FIG. 6. The second NOR-gate element NOR2 may include a first input terminal that is connected to the fifth node N5, a second input terminal that receives the set signal S, a third input terminal that is connected to the output terminal of the fourth AND-gate element AND4, and an output terminal (e.g., the sixth node N6) that outputs the NOR-operation result among the voltage signal of the fifth node N5, the set signal S, and the AND-operation result of the fourth AND-gate element AND4. Based on the above structure, the flip-flop 400 may output the output data Q having a logic 'high' level when the set signal S has a logic 'high' level. Specifically, as illustrated in FIG. 15A, when the set signal S has a logic 'low' level, the set signal S input to the second input terminal of the second NOR-gate element NOR2 may not affect the NOR-operation result of the second NOR-gate element NOR2. Thus, the second NOR-gate element NOR2 of the flip-flop 400 may operate as the second NOR-gate element NOR2 of the flip-flop 200 of FIG. 6. As a result, the flip-flop 400 may latch the input data D at the rising edges of the clock signal CK and may output the latched input data D as the output data Q at the output node OUT. On the other hand, as illustrated in FIG. 15B, when the set signal S has a logic 'high' level, the NOR-operation result of the second NOR-gate element NOR2 may have a logic 'low' level (e.g., the voltage signal of the sixth node N6 may have a logic 'low' level). Here, since the second inverter element INV2 inverts the voltage signal of the sixth node N6 to output the output data Q, the voltage signal of the output node OUT may be a voltage signal generated by inverting the voltage signal of the sixth node N6. Thus, the voltage signal of the output node OUT may have a logic 'high' level. In summary, the flip-flop 400 may set the output data Q to have a logic 'high' level when the set signal S has a logic 'high' level.

Figure 16:
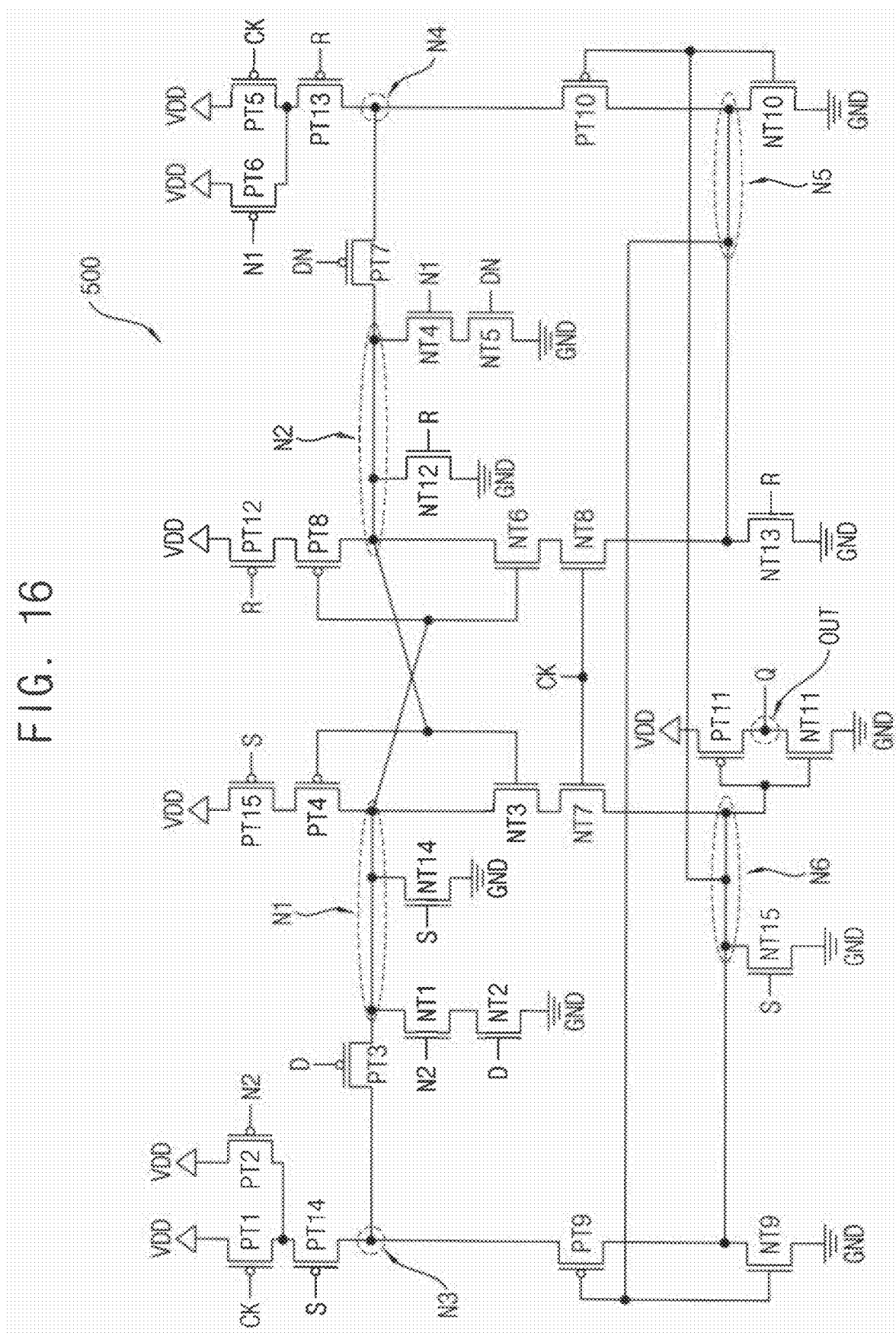
FIG. 16 is a circuit diagram illustrating a flip-flop according to some example embodiments.
Figure 17:
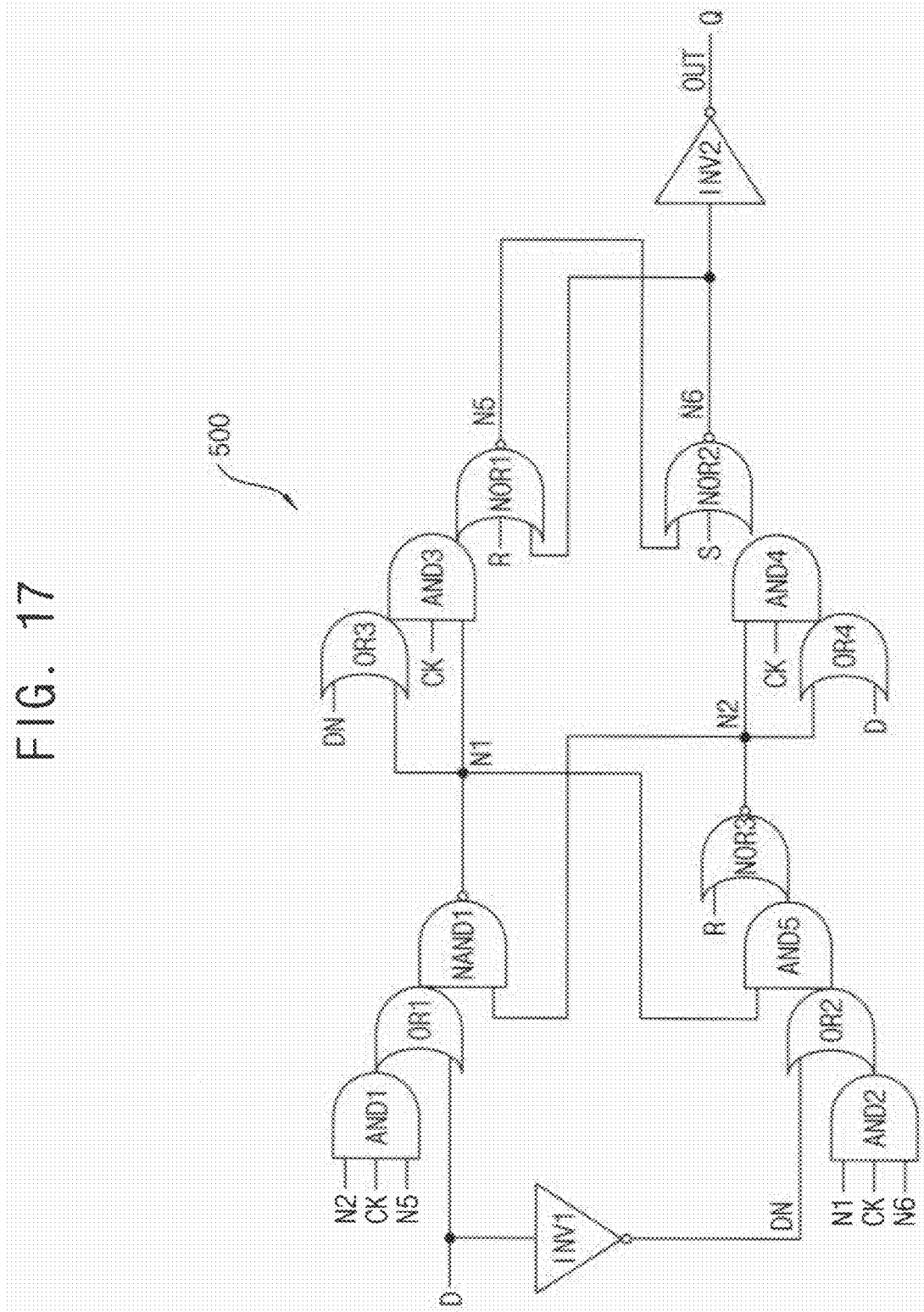
FIG. 17 is a block diagram illustrating an example in which the flip-flop of FIG. 16 is implemented by logic elements.

FIG. 16 is a circuit diagram illustrating a flip-flop according to some example embodiments. FIG. 17 is a block diagram illustrating an example in which the flip-flop of FIG. 16 is implemented by logic elements.

Referring to FIGS. 16 and 17, the flip-flop 500 may include first through fifteenth PMOS transistors PT1 through PT15 and first through fifteenth NMOS transistors NT1 through NT15. That is, the flip-flop 500 may have a structure in which the twelfth and thirteenth PMOS transistors PT12 and PT13 and the twelfth and thirteenth NMOS transistors NT12 and NT13 are added to the flip-flop 200 of FIG. 4 to include the reset function and the fourteenth and fifteenth PMOS transistors PT14 and PT15 and the fourteenth and fifteenth NMOS transistors NT14 and NT15 are added to the flip-flop 200 of FIG. 4 to include the set function. Since the twelfth through fifteenth PMOS transistors PT12 through PT15 and the twelfth through fifteenth NMOS transistors NT12 through NT15 are described above, duplicated description related thereto will not be repeated. When the flip-flop 500 is implemented (or, expressed) by logic elements, the flip-flop 500 may include a first AND-gate element AND1, a first OR-gate element OR1, a first NAND-gate element NAND1, a first inverter element INV1, a second AND-gate element AND2, a second OR-gate element OR2, a fifth AND-gate element AND5, a third NOR-gate element NOR3, a third OR-gate element OR3, a third AND-gate element AND3, a first NOR-gate element NOR1, a fourth OR-gate element OR4, a fourth AND-gate element AND4, a second NOR-gate element NOR2, and a second inverter element INV2. As described above, the flip-flop 500 may have a structure in which the second NAND-gate element NAND2 of the flip-flop 200 of FIG. 6 is replaced with the fifth AND-gate element AND5 and the third NOR-gate element NOR3, the reset signal R is additionally input to the first NOR-gate element NOR1 of the flip-flop 200 of FIG. 6, and the set signal S is additionally input to the second NOR-gate element NOR2 of the flip-flop 200 of FIG. 6 to include both the reset function and the set function. Since these logic elements are described above, duplicated description related thereto will not be repeated.

Figure 18:
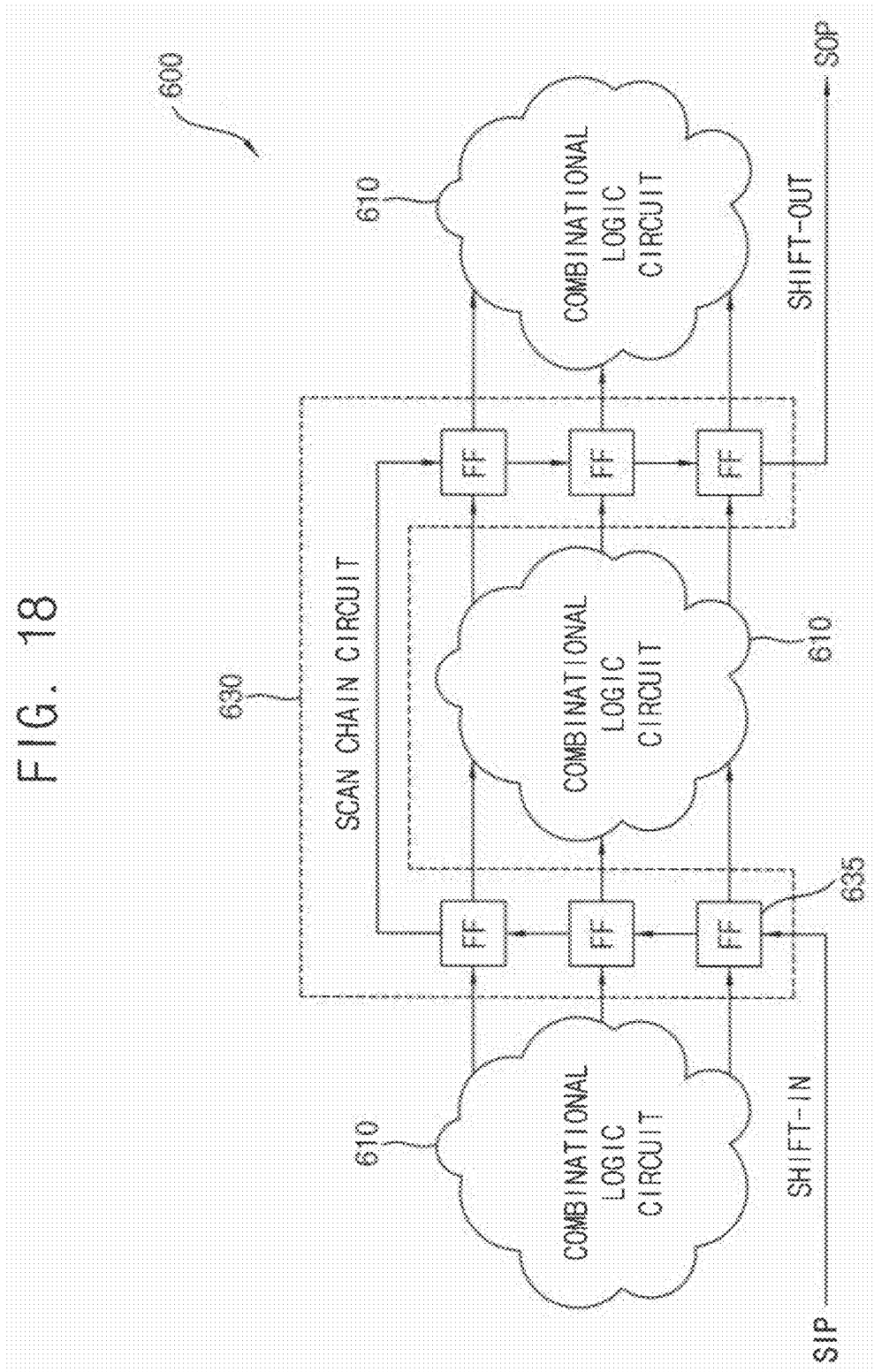
FIG. 18 is a block diagram illustrating an integrated circuit including a scan chain circuit according to some example embodiments.
Figure 19:
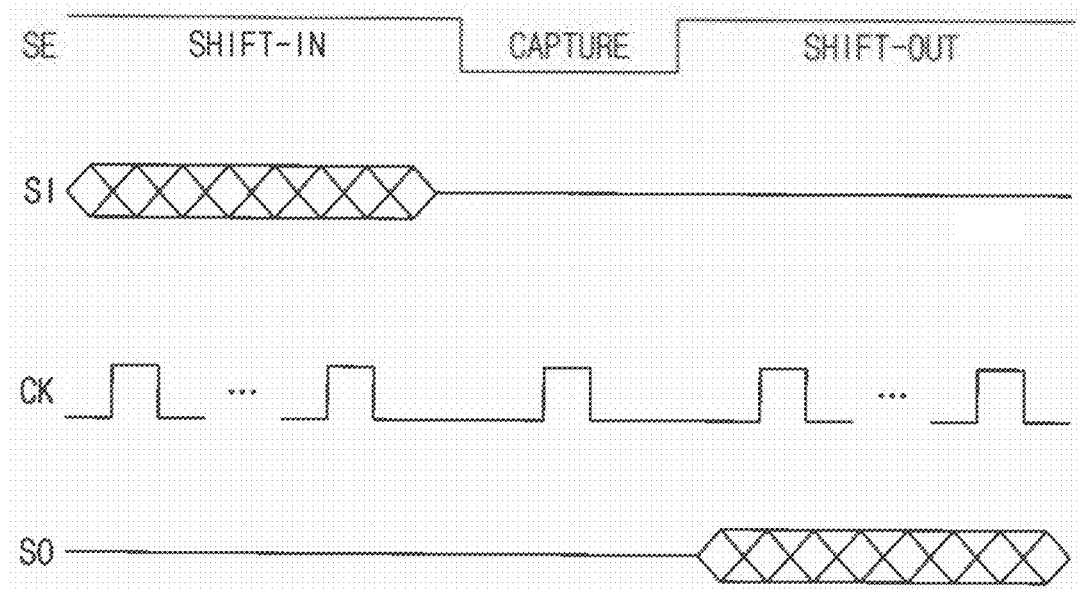
FIG. 19 is a timing diagram for describing an operation of a flip-flop included in a scan chain circuit of the integrated circuit of FIG. 18.

FIG. 18 is a block diagram illustrating an integrated circuit including a scan chain circuit according to some example embodiments. FIG. 19 is a timing diagram for describing an operation of a flip-flop included in a scan chain circuit of the integrated circuit of FIG. 18.

Referring to FIGS. 18 and 19, the integrated circuit 600 may include a combinational logic circuit 610 and a scan chain circuit 630. Here, the combinational logic circuit 610 may include a plurality of flip-flops 635, and the flip-flops 635 may form a scan path by being connected to the combinational logic circuit 610. Although it is illustrated in FIG. 18 that all combinational logic circuits 610 are connected to the scan chain circuit 630 in the integrated circuit 600, in some other example embodiments, some combinational logic circuits 610 for which a scan test is not performed may not be connected to the scan chain circuit 630 in the integrated circuit 600. In some example embodiments, the integrated circuit 600 may be implemented as a system on-chip (SOC).

The combinational logic circuit 610 may include logic cones, multiplexers, etc. Here, the combinational logic circuit 610 may be connected to the scan chain circuit 630 in order that a scan test is performed for the combinational logic circuit 610. Generally, a scan test may be performed for the integrated circuit 600 by performing a shift-in operation that sequentially loads a test pattern SI on the scan chain circuit 630 (e.g., indicated by SHIFT-IN), by performing a capture operation that stores an observation value SO of the combinational logic circuit 610 in the scan chain circuit 630 (e.g., indicated by CAPTURE), where the observation value SO is generated based on the test pattern SI that is loaded on the scan chain circuit 630, and by performing a shift-out operation that sequentially outputs the observation value SO stored in the scan chain circuit 630 (e.g., indicated by SHIFT-OUT). Here, the flip-flops 635 included in the scan chain circuit 630 may be triggered at rising edges of a clock signal CK. Here, except that a multiplexer that selectively provides a scan enable signal SE is included, each of the flip-flops 635 included in the scan chain circuit 630 may be the flip-flop 100 of FIGS. 1A and 1B, the flip-flop 200 of FIG. 4, the flip-flop 300 of FIG. 8, the flip-flop 400 of FIG. 12, or the flip-flop 500 of FIG. 16. Since operations and structures of the flip-flops 635 are described above, duplicated description will not be repeated. For example, as illustrated in FIGS. 18 and 19, when the scan enable signal SE applied to the integrated circuit 600 has a logic 'high' level, the shift-in operation that sequentially applying a specific test pattern SI to the scan chain circuit 630 via a scan test input terminal SIP of the integrated circuit 600 may be performed (e.g., indicated by SHIFT-IN). Next, the capture operation that stores the observation value SO of the combinational logic circuit 610 in the scan chain circuit 630 may be performed (e.g., indicated by CAPTURE), where the observation value SO is generated based on the test pattern SI loaded on the scan chain circuit 630. Here, the scan enable signal SE applied to the integrated circuit 600 may have a logic 'low' level. Subsequently, while the scan enable signal SE applied to the integrated circuit 600 has a logic 'high' level again, the shift-out operation that sequentially outputs the observation value SO stored in the scan chain circuit 630 via a scan test output terminal SOP of the integrated circuit 600 may be performed (e.g., indicated by SHIFT-OUT). In some example embodiments, a plurality of test patterns SI may be used for the scan test. In this case, the shift-out operation that outputs the observation value SO generated based on a test pattern SI may be concurrently performed with the shift-in operation that inputs a next test pattern SI.

Figure 20:
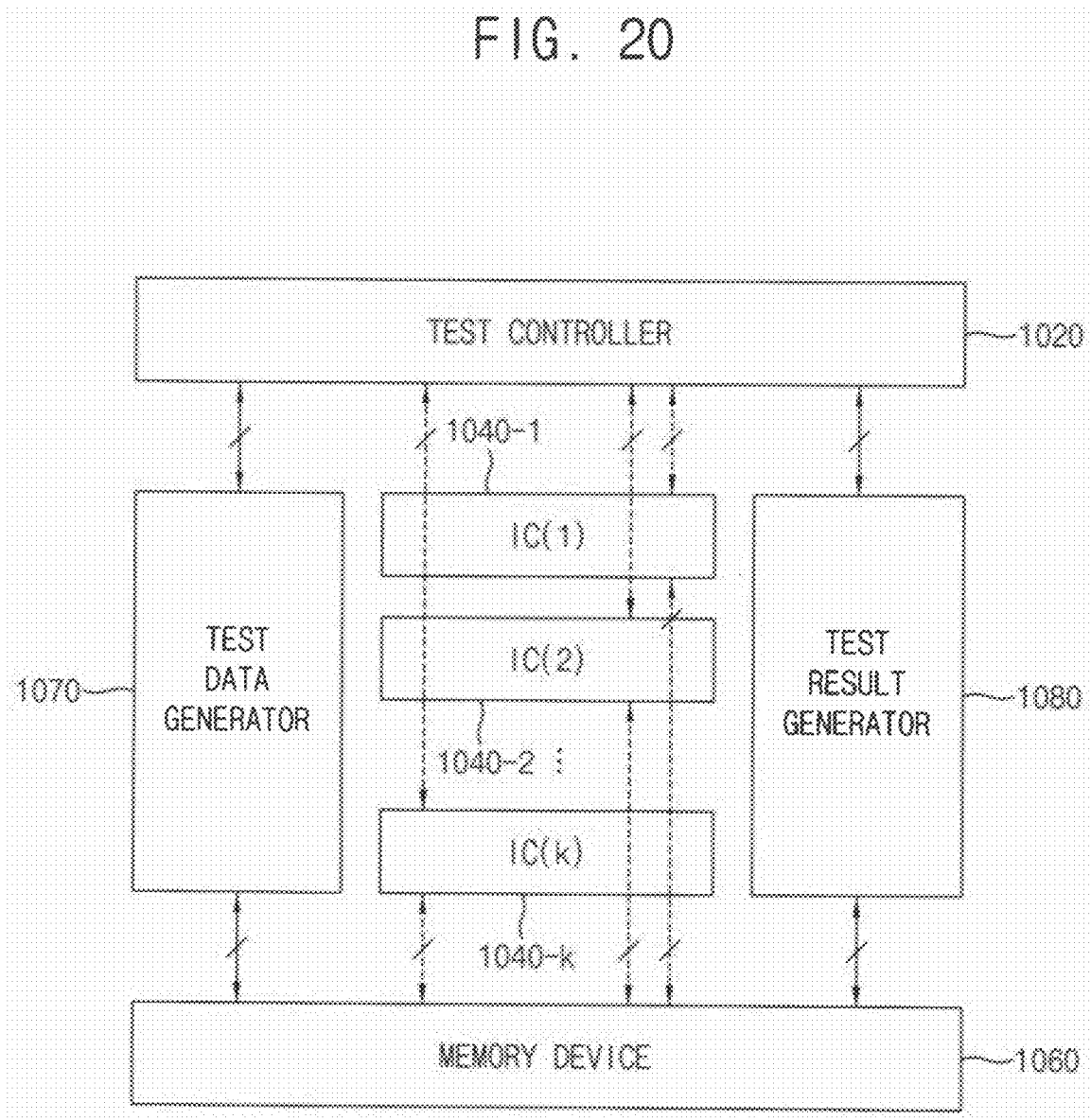
FIG. 20 is a block diagram illustrating an integrated circuit testing system according to some example embodiments.

FIG. 20 is a block diagram illustrating an integrated circuit testing system according to some example embodiments.

Referring to FIG. 20, the integrated circuit testing system 1000 may include a test controller 1020, first through (k)th integrated circuits 1040-1 through 1040-k, a memory device 1060, a test data generator 1070, and a test result generator 1080, where k is an integer greater than or equal to 1. Here, each of the first through (k)th integrated circuits 1040-1 through 1040-k may include a combinational logic circuit and a scan chain circuit.

The test controller 1020 may control a scan test for each of the first through (k)th integrated circuits 1040-1 through 1040-k by controlling the first through (k)th integrated circuits 1040-1 through 1040-k, the memory device 1060, the test data generator 1070, and the test result generator 1080. The integrated circuit testing system 1000 may perform the scan test for each of the first through (k)th integrated circuits 1040-1 through 1040-k by performing a shift-in operation that sequentially loads a test pattern on the scan chain circuit, by performing a capture operation that stores an observation value of the combinational logic circuit in the scan chain circuit, where the observation value is generated based on the test pattern loaded on the scan chain circuit, and by performing a shift-out operation that sequentially outputs the observation value stored in the scan chain circuit. Here, the scan chain circuit included in each of the first through (k)th integrated circuits 1040-1 through 1040-k may include a plurality of flip-flops, and the flip-flops may form a scan path by being connected to the combinational logic circuit. In some example embodiments, each of the first through (k)th integrated circuits 1040-1 through 1040-k may be implemented as a system on-chip. Here, the flip-flops of the scan chain circuit included in each of the first through (k)th integrated circuits 1040-1 through 1040-k may be triggered at rising edges of the clock signal. For example, each of the flip-flops may be the flip-flop 100 of FIGS. 1A and 1B, the flip-flop 200 of FIG. 4, the flip-flop 300 of FIG. 8, the flip-flop 400 of FIG. 12, or the flip-flop 500 of FIG. 16. Since operations and structures of the flip-flops are described above, duplicated description will not be repeated.

In the integrated circuit testing system 1000, the memory device 1060 may store data for the scan test. Specifically, the memory device 1060 may store the test pattern that is generated by the test data generator 1070 and applied to the scan chain circuit included in each of the first through (k)th integrated circuits 1040-1 through 1040-k, the observation value of the combinational logic circuit that is generated based on the test pattern, a reference pattern that is compared with the observation value, a test result (e.g., a comparison result between the observation value and the reference pattern) that is output from the test result generator 1080, etc. For example, the memory device 1060 may include a volatile semiconductor memory device such as a dynamic random access memory (DRAM) device, a static random access memory (SRAM) device, a mobile DRAM device, etc., and/or a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In some example embodiments, the integrated circuit testing system 1000 may further include a storage device such as a solid state drive (SSD) device, a hard disk drive (HDD) device, a CD-ROM device, etc.

The test data generator 1070 may generate the test pattern that is applied to the scan chain circuit included in each of the first through (k)th integrated circuits 1040-1 through 1040-k. The test result generator 1080 may generate the test result by comparing the observation value output from each of the first through (k)th integrated circuits 1040-1 through 1040-k with the reference pattern. As described above, the observation value may be generated by performing the shift-in operation that sequentially loads the test pattern on the scan chain circuit, by performing the capture operation that stores the observation value of the combinational logic circuit in the scan chain circuit, and by performing the shift-out operation that sequentially outputs the observation value stored in the scan chain circuit. For example, when the observation value is consistent with the reference pattern, the test result generator 1080 may output the test result indicating that no defect exists in the combinational logic circuit. On the other hand, when the observation value is inconsistent with the reference pattern, the test result generator 1080 may output the test result indicating that a defect exists in the combinational logic circuit. In some example embodiments, to obtain a more accurate test result, the integrated circuit testing system 1000 may perform the scan test for each of the first through (k)th integrated circuits 1040-1 through 1040-k several times. Although a flip-flop, a scan chain circuit, and an integrated circuit testing system according to some example embodiments are described with reference to FIGS. 1 through 20, the flip-flop, the scan chain circuit, and the integrated circuit testing system are not limited thereto. Thus, many modifications of the flip-flop, the scan chain circuit, and the integrated circuit testing system are possible without materially departing from the novel teachings and advantages described herein.

Some example embodiments may be applied to a flip-flop, a scan chain circuit, and an integrated circuit (e.g., a system on-chip, etc.) including the flip-flop and the scan chain circuit. For example, some example embodiments may be applied to various integrated circuits included in a computer, a workstation, a laptop, a game console, a cellular phone, a smart phone, a smart pad, a smart watch, a tablet PC, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages described herein. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flip-flop comprising:
   a first OR-gate element including a first input terminal configured to receive a clock signal, a second input terminal configured to receive input data, and an output terminal configured to output an OR-operation result between the clock signal and the input data;
   a first NAND-gate element including a first input terminal connected to the output terminal of the first OR-gate element, a second input terminal connected to a second node, and an output terminal connected to a first node, said output terminal of said first NAND-gate element being configured to output a NAND-operation result between the OR-operation result of the first OR-gate element and a voltage signal of the second node at the first node;
   a second OR-gate element including a first input terminal configured to receive inverted input data, a second input terminal configured to receive the clock signal, and an output terminal configured to output an OR-operation result between the inverted input data and the clock signal;
   a second NAND-gate element including a first input terminal connected to the first node, a second input terminal connected to the output terminal of the second OR-gate element, and an output terminal connected to the second node, said output terminal of the second NAND-gate element being configured to output a NAND-operation result between a voltage signal of the first node and the OR-operation result of the second OR-gate element at the second node;
   a first inverter element connected between the second input terminal of the first OR-gate element and the first input terminal of the second OR-gate element, said first inverter element being configured to invert the input data and to output the inverted input data;
   a third AND-gate element including a first input terminal connected to the first node, a second input terminal configured to receive the clock signal, and an output terminal configured to output an AND-operation result between the clock signal and the voltage signal of the first node;
   a first NOR-gate element including a first input terminal connected to the output terminal of the third AND-gate element, a second input terminal connected to a sixth node, and an output terminal connected to a fifth node, said output terminal of the first NOR-gate element being configured to output a NOR-operation result between the AND-operation result of the third AND-gate element and a voltage signal of the sixth node at the fifth node;

a fourth AND-gate element including a first input terminal connected to the second node, a second input terminal configured to receive the clock signal, and an output terminal configured to output an AND-operation result between the voltage signal of the second node and the clock signal; and a second NOR-gate element including a first input terminal connected to the fifth node, a second input terminal connected to the output terminal of the fourth AND-gate element, and an output terminal connected to the sixth node, said output terminal of the second NOR-gate element being configured to output a NOR-operation result between a voltage signal of the fifth node and the AND-operation result of the fourth AND-gate element at the sixth node.

2. The flip-flop of claim 1, the third AND-gate element further including a third input terminal configured to receive the inverted input data, and the fourth AND-gate element further including a third input terminal configured to receive the input data.

3. The flip-flop of claim 1, further comprising:
a second inverter element connected between the sixth node and an output node, said second inverter element being configured to invert the voltage signal of the sixth node and to output output data at the output node.

4. A flip-flop comprising:
a first AND-gate element including a first input terminal connected to a second node, a second input terminal configured to receive a clock signal, a third input terminal connected to a fifth node, and an output terminal configured to output an AND-operation result among a voltage signal of the second node, the clock signal, and a voltage signal of the fifth node;

a first OR-gate element including a first input terminal connected to the output terminal of the first AND-gate element, a second input terminal configured to receive input data, and an output terminal configured to output an OR-operation result between the AND-operation result of the first AND-gate element and the input data;

a first NAND-gate element including a first input terminal connected to the output terminal of the first OR-gate element, a second input terminal connected to the second node, and an output terminal connected to a first node, said output terminal of the first NAND-gate element being configured to output a NAND-operation result between the OR-operation result of the first OR-gate element and the voltage signal of the second node at the first node;

a second AND-gate element including a first input terminal connected to the first node, a second input terminal configured to receive the clock signal, a third input terminal connected to a sixth node, and an output terminal configured to output an AND-operation result among a voltage signal of the first node, the clock signal, and a voltage signal of the sixth node;

a second OR-gate element including a first input terminal configured to receive inverted input data, a second input terminal connected to the output terminal of the second AND-gate element, and an output terminal configured to output an OR-operation result between the inverted input data and the AND-operation result of the second AND-gate element;

a second NAND-gate element including a first input terminal connected to the first node, a second input terminal connected to the output terminal of the second OR-gate element, and an output terminal connected to the second node, said output terminal of the second NAND-gate element being configured to output a NAND-operation result between the voltage signal of the first node and the OR-operation result of the second OR-gate element at the second node;

a first inverter element connected between the second input terminal of the first OR-gate element and the first input terminal of the second OR-gate element, said first inverter element being configured to invert the input data and to output the inverted input data;

a third OR-gate element including a first input terminal configured to receive the inverted input data, a second input terminal connected to the first node, and an output terminal configured to output an OR-operation result between the inverted input data and the voltage signal of the first node;

a third AND-gate element including a first input terminal connected to the output terminal of the third OR-gate element, a second input terminal configured to receive the clock signal, a third input terminal that is connected to the first node, and an output terminal configured to output an AND-operation result among the OR-operation result of the third OR-gate element, the clock signal and the voltage signal of the first node;

a first NOR-gate element including a first input terminal connected to the output terminal of the third AND-gate element, a second input terminal connected to the sixth node, and an output terminal connected to the fifth node, said output terminal of the first NOR-gate element being configured to output a NOR-operation result between the AND-operation result of the third AND-gate element and the voltage signal of the sixth node at the fifth node;

a fourth OR-gate element including a first input terminal connected to the second node, a second input terminal configured to receive the input data, and an output terminal configured to output an OR-operation result between the voltage signal of the second node and the input data;

a fourth AND-gate element including a first input terminal connected to the second node, a second input terminal configured to receive the clock signal, a third input terminal connected to the output terminal of the fourth OR-gate element, and an output terminal configured to output an AND-operation result among the voltage signal of the second node, the clock signal, and the OR-operation result of the fourth OR-gate element; and a second NOR-gate element including a first input terminal connected to the fifth node, a second input terminal connected to the output terminal of the fourth AND-gate element, and an output terminal connected to the sixth node, said output terminal of the second NOR-gate element being configured to output a NOR-operation result between the voltage signal of the fifth node and the AND-operation result of the fourth AND-gate element at the sixth node.

5. The flip-flop of claim 4, further comprising:
a second inverter element connected between the sixth node and an output node, said second inverter element being configured to invert the voltage signal of the sixth node and to output output data at the output node.

* * * * *